(12) United States Patent
Watanabe

(10) Patent No.: US 12,408,493 B2
(45) Date of Patent: Sep. 2, 2025

(54) LIGHT-EMITTING ELEMENT INCLUDING FIRST SEMICONDUCTOR LAYER HAVING EXPOSED PORTION WITH FIRST REGION AND SECOND REGIONS

(71) Applicant: NICHIA CORPORATION, Anan (JP)

(72) Inventor: Kentaro Watanabe, Anan (JP)

(73) Assignee: NICHIA CORPORATION, Anan (JP)

( * ) Notice: Subject to any disclaimer, the term of this patent is extended or adjusted under 35 U.S.C. 154(b) by 538 days.

(21) Appl. No.: 17/750,783

(22) Filed: May 23, 2022

(65) Prior Publication Data
US 2022/0384685 A1    Dec. 1, 2022

(30) Foreign Application Priority Data

May 26, 2021 (JP) ................................ 2021-088186
Dec. 14, 2021 (JP) ................................ 2021-202182

(51) Int. Cl.
H10H 20/831    (2025.01)
H10H 20/857    (2025.01)

(52) U.S. Cl.
CPC ...... H10H 20/8312 (2025.01); H10H 20/857 (2025.01)

(58) Field of Classification Search
CPC ............................. H01L 33/382; H01L 33/32
USPC ......................................................... 257/79
See application file for complete search history.

(56) References Cited

U.S. PATENT DOCUMENTS

| | | |
|---|---|---|
| 2004/0084684 A1 | 5/2004 | Tarsa et al. |
| 2005/0133795 A1 | 6/2005 | Park et al. |
| 2005/0211997 A1 | 9/2005 | Suehiro et al. |
| 2006/0049335 A1 | 3/2006 | Suehiro et al. |
| 2009/0008668 A1 | 1/2009 | Matsumura |
| 2009/0057707 A1 | 3/2009 | Katsuno et al. |
| 2010/0051987 A1 | 3/2010 | Katsuno et al. |
| 2010/0051994 A1 | 3/2010 | Katsuno et al. |
| 2010/0117114 A1 | 5/2010 | Suzuki et al. |
| 2011/0062488 A1 | 3/2011 | Uemura et al. |
| 2014/0124821 A1 | 5/2014 | Tomonari et al. |

(Continued)

FOREIGN PATENT DOCUMENTS

| | | | |
|---|---|---|---|
| CN | 107546304 | * | 1/2018 |
| CN | 111933770 | * | 11/2020 |

(Continued)

*Primary Examiner* — Sheng-Bai Zhu
(74) *Attorney, Agent, or Firm* — Foley & Lardner LLP

(57) ABSTRACT

A light-emitting element includes: a substrate; a semiconductor layered body including: a first semiconductor layer, an active layer, and a second semiconductor layer, wherein a portion of the first semiconductor layer is exposed from the active layer and the second semiconductor layer; a first electrode disposed on the exposed portion of the first semiconductor layer and electrically connected to the first semiconductor layer; a second electrode disposed on the second semiconductor layer; a first insulating layer covering the first electrode and the second electrode and having a first opening above the first electrode and a second opening above the second electrode; a first pad electrode disposed on the first insulating layer and electrically connected to the first electrode through the first opening; and a second pad electrode disposed on the first insulating layer and electrically connected to the second electrode through the second opening.

19 Claims, 15 Drawing Sheets

(56) References Cited

U.S. PATENT DOCUMENTS

| | | |
|---|---|---|
| 2016/0163537 A1 | 6/2016 | Tanaka |
| 2018/0040770 A1 | 2/2018 | Obata et al. |
| 2018/0182922 A1* | 6/2018 | Emura .................... H01L 33/62 |
| 2018/0190877 A1 | 7/2018 | Hirano et al. |
| 2018/0358511 A1 | 12/2018 | Obata |
| 2019/0051797 A1 | 2/2019 | Sung et al. |
| 2019/0067523 A1 | 2/2019 | Kinoshita |
| 2019/0148589 A1 | 5/2019 | Yamada et al. |
| 2019/0148596 A1 | 5/2019 | Park et al. |
| 2020/0321491 A1 | 10/2020 | Hirano et al. |

FOREIGN PATENT DOCUMENTS

| | | | |
|---|---|---|---|
| EP | 3010049 | * | 4/2016 |
| JP | 2003-524295 A | | 8/2003 |
| JP | 2005-183909 A | | 7/2005 |
| JP | 2006-066868 A | | 3/2006 |
| JP | 2006-128457 A | | 5/2006 |
| JP | 2009-033133 A | | 2/2009 |
| JP | 2009-049267 A | | 3/2009 |
| JP | 2009-135538 A | | 6/2009 |
| JP | 2010-056322 A | | 3/2010 |
| JP | 2010-056324 A | | 3/2010 |
| JP | 2010-118543 A | | 5/2010 |
| JP | 2010-171142 A | | 8/2010 |
| JP | 2011-061036 A | | 3/2011 |
| JP | 2011-066048 A | | 3/2011 |
| JP | 2011-086899 A | | 4/2011 |
| JP | 2012-142639 A | | 7/2012 |
| JP | 2012-235152 A | | 11/2012 |
| JP | 2013-102192 A | | 5/2013 |
| JP | 2013-211598 A | | 10/2013 |
| JP | 2014-093480 A | | 5/2014 |
| JP | 2014-107475 A | | 6/2014 |
| JP | 2014-116397 A | | 6/2014 |
| JP | 2014-116412 A | | 6/2014 |
| JP | 2014-131000 A | | 7/2014 |
| JP | 2014-138007 A | | 7/2014 |
| JP | 2014-138008 A | | 7/2014 |
| JP | 5573138 | * | 8/2014 |
| JP | 2014-220539 A | | 11/2014 |
| JP | 2016-111124 A | | 6/2016 |
| JP | 2017-028032 A | | 2/2017 |
| JP | 2019-036729 A | | 3/2019 |
| JP | 2019-527480 A | | 9/2019 |
| JP | 6867536 B1 | | 4/2021 |
| KR | 102390828 | * | 4/2022 |
| WO | WO-2016/143574 A1 | | 9/2016 |
| WO | WO-2017/014094 A1 | | 1/2017 |
| WO | WO-2017/022754 A1 | | 2/2017 |
| WO | WO-2017/150280 A1 | | 9/2017 |
| WO | WO-2017/208535 A1 | | 12/2017 |
| WO | WO-2018/003228 A1 | | 1/2018 |
| WO | WO-2018/061080 A1 | | 4/2018 |

* cited by examiner

LIGHT-EMITTING ELEMENT INCLUDING FIRST SEMICONDUCTOR LAYER HAVING EXPOSED PORTION WITH FIRST REGION AND SECOND REGIONS

CROSS-REFERENCE TO RELATED APPLICATION

This application claims priority to Japanese Patent Application No. 2021-088186, filed on May 26, 2021, and Japanese Patent Application No. 2021-202182, filed on Dec. 14, 2021. The entire contents of these applications are hereby incorporated by reference.

BACKGROUND

The present disclosure relates to a light-emitting element.

Japanese Patent Publication No. 2017-28032 discloses a light-emitting element including a layered body including an n-type layer, an active layer, and a p-type layer, an n-electrode formed on the n-type layer, and a p-electrode formed on the p-type layer.

SUMMARY

An object of certain embodiments is to provide a light-emitting element that is configured such that a current flows in a broader region in an active layer, and that exhibits good heat dissipation performance.

A light-emitting element according to an embodiment includes a substrate, a semiconductor layered body including a first semiconductor layer of a first conduction type disposed on the substrate, an active layer disposed on the first semiconductor layer, and a second semiconductor layer of a second conduction type disposed on the active layer, a portion of the first semiconductor layer being exposed from the active layer and the second semiconductor layer, a first electrode disposed on the portion of the first semiconductor layer and electrically connected to the first semiconductor layer, a second electrode disposed on the second semiconductor layer and electrically connected to the second semiconductor layer, a first insulating layer covering the first electrode and the second electrode and having a first opening above the first electrode and a second opening above the second electrode, a first pad electrode disposed on the first insulating layer and electrically connected to the first electrode through the first opening, and a second pad electrode disposed on the first insulating layer and electrically connected to the second electrode through the second opening. In a top view, the portion of the first semiconductor layer includes a first region lying between the first pad electrode and the second pad electrode and extending in a first direction parallel to an upper surface of the substrate and a plurality of second regions extending from the first region in a second direction intersecting the first direction, the second direction being a direction from the first region to the first pad electrode. The first electrode is disposed on the first region and the plurality of second regions. The first pad electrode covers the active layer located between the plurality of second regions in a top view.

According to certain embodiments, a light-emitting element that is configured such that a current flows in a wider region in an active layer and that exhibits good heat dissipation performance can be provided.

DETAILED DESCRIPTION

Figure 1:
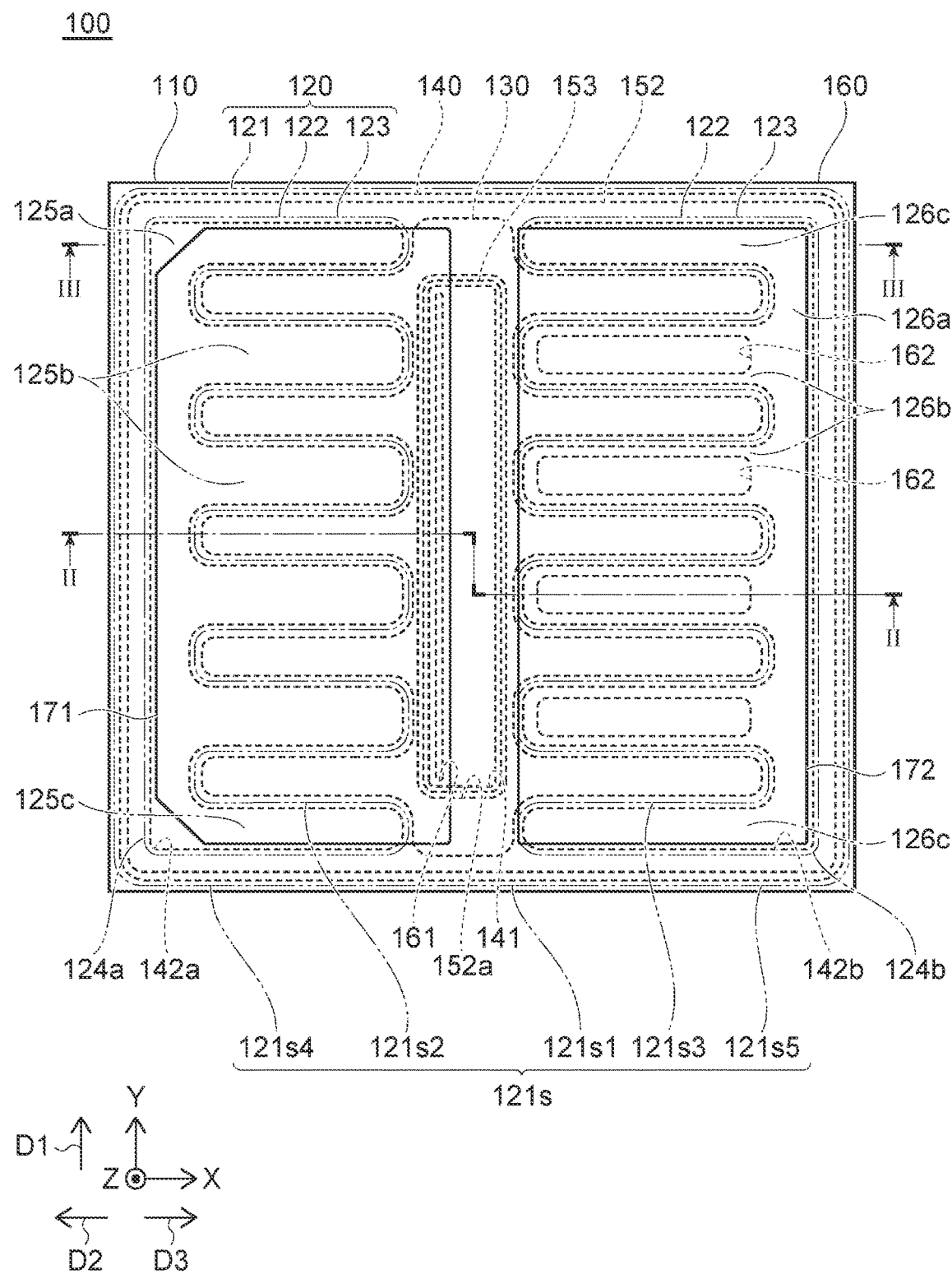
FIG. 1 is a schematic top view of a light-emitting element according to a first embodiment.

Certain embodiments of the present disclosure will be described below with reference to the accompanying drawings. The drawings are schematic or conceptual, and the relationship between a thickness and a width of each component, the ratio between sizes of components, etc., in the drawings is not necessarily the same as those of an actual product. Also, the dimensions and ratios of the same component in different drawings may be different from each other. In the present specification and the drawings, an element that is the same as that in a drawing that has been previously described is indicated with the same reference numeral, and its repeated detailed description is omitted as appropriate.

For ease of understanding, the arrangement and structure of each portion will be described below on the basis of an XYZ orthogonal coordinate system. The X-axis, the Y-axis, and the Z-axis are orthogonal to one another. The direction in which the X-axis extends is referred to as an "X direction," the direction in which the Y-axis extends is referred to as a "Y direction," and the direction in which the Z-axis extends is referred to as a "Z direction." The Z direction and the reverse direction are respectively regarded as the upward and downward directions for ease of understanding, but these directions are unrelated to the direction of gravity.

Viewing a member of interest from above or seeing through the member of interest as appropriate is referred to as "top view." The direction of the arrow of the X direction is referred to as a "+X direction," and the reverse direction is referred to as a "—X direction." The direction of the arrow of the Y direction is referred to as a "+Y direction," and the reverse direction is referred to as a "−Y direction."

First Embodiment

A first embodiment will be described.

Figure 2:
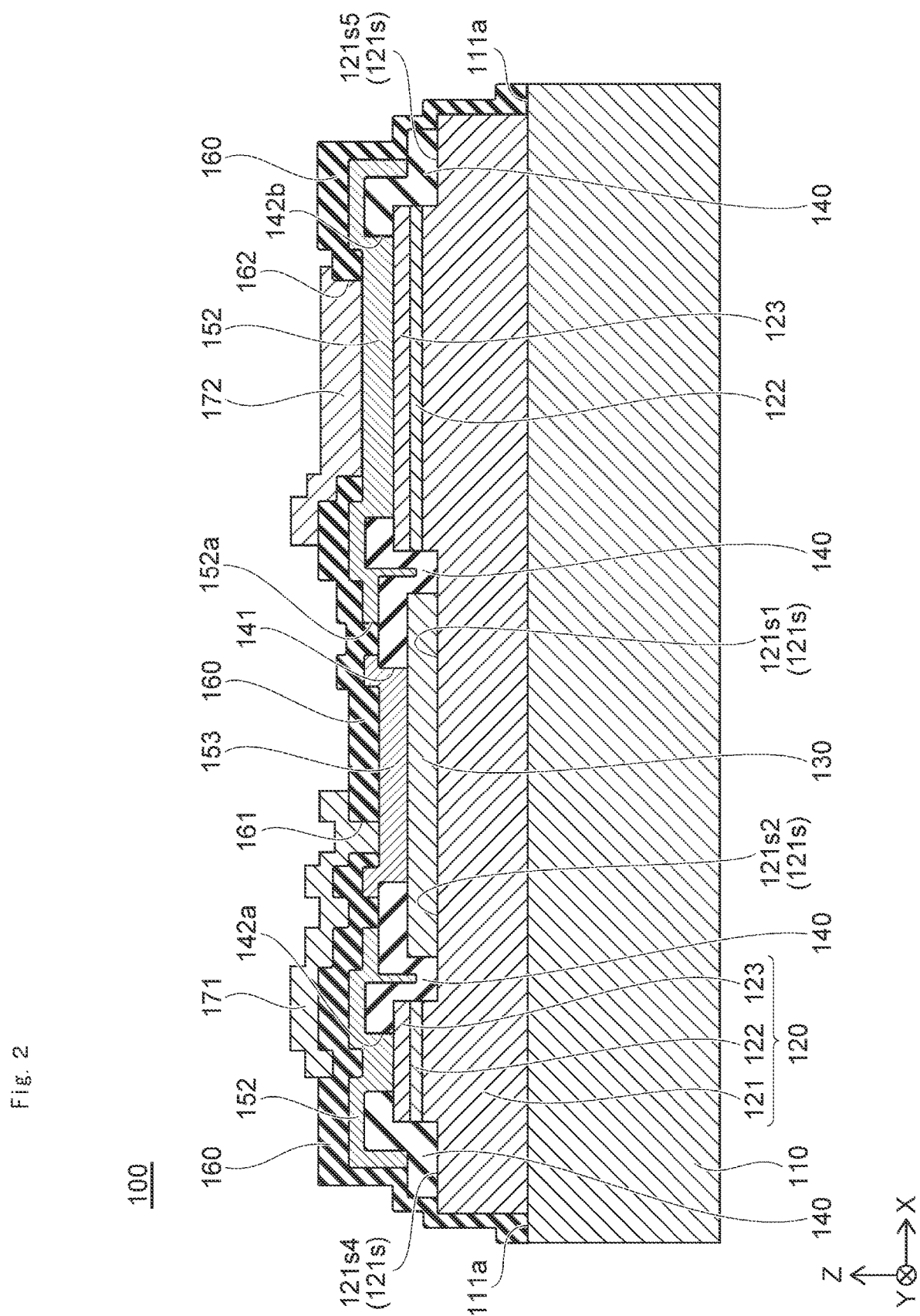
FIG. 2 is a schematic cross-sectional view taken along the line II-II of FIG. 1.
Figure 3:
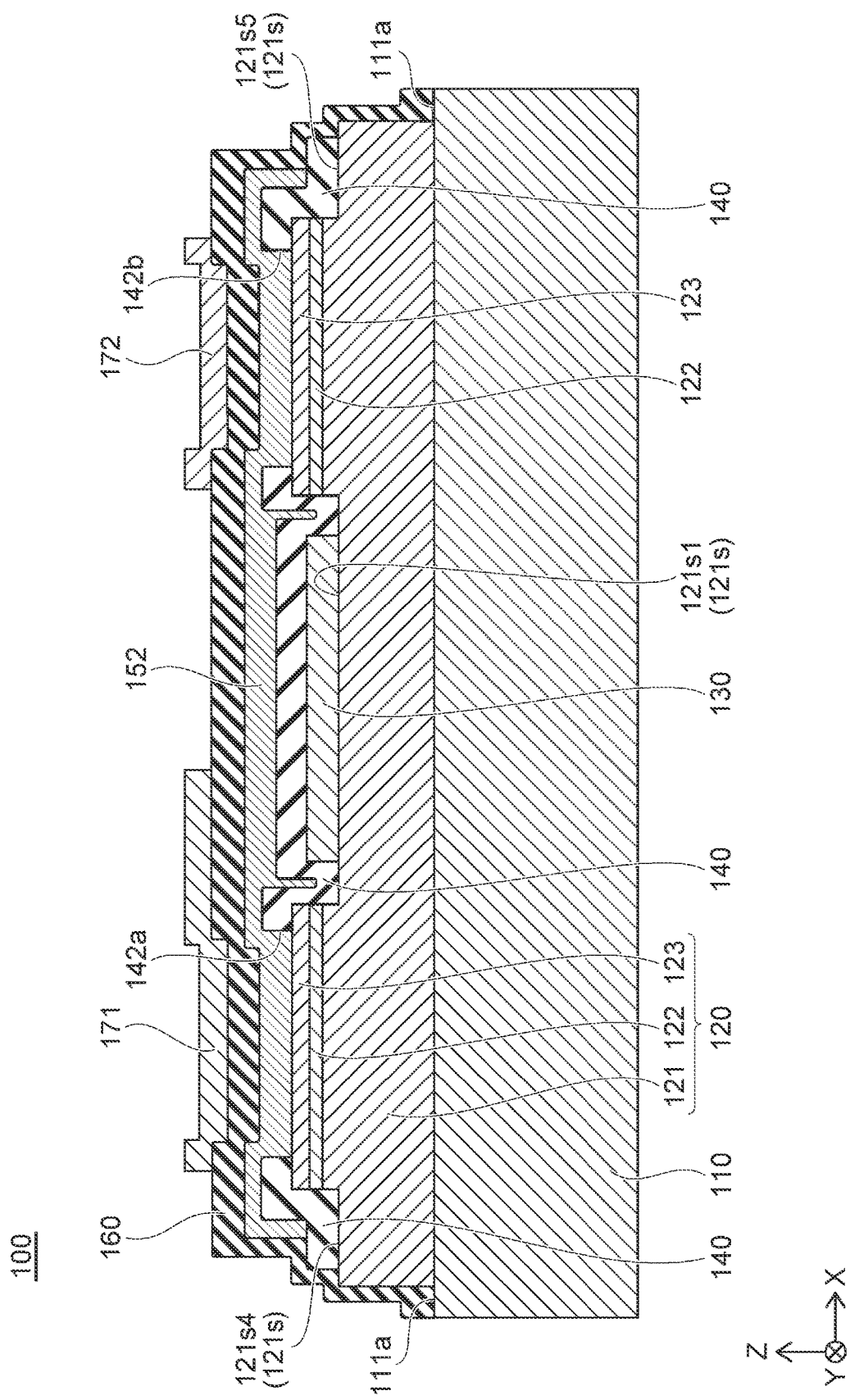
FIG. 3 is a schematic cross-sectional view taken along the line of FIG. 1.

FIG. 1 is a schematic top view of a light-emitting element according to the present embodiment. FIG. 2 is a schematic cross-sectional view taken along the line II-II of FIG. 1. FIG. 3 is a schematic cross-sectional view taken along the line III-III of FIG. 1.

A light-emitting element 100 according to the present embodiment can be flip-chip mounted. As shown in FIG. 2 and FIG. 3, the light-emitting element 100 includes a substrate 110, a semiconductor layered body 120, a first electrode 130, an insulating layer 140 (corresponding to a second insulating layer), a second electrode 152, an insulating layer 160 (corresponding to a first insulating layer), a first pad electrode 171, and a second pad electrode 172. The light-emitting element 100 may further include a third electrode 153. Each part of the light-emitting element 100 will be described below in detail.

The substrate 110 is a member that supports the semiconductor layered body 120. For example, the substrate 110 is a member used for epitaxially growing the semiconductor layered body 120. The substrate 110 is a light-transmissive member made of sapphire or the like.
Other examples of the material of the substrate 110 include spinel ($MgAl_2O_4$), silicon carbide (SiC), silicon (Si), zinc sulfide (ZnS), zinc oxide (ZnO), gallium arsenide (GaAs), diamond, lithium niobate, and neodymium gallate. The upper surface of the substrate may have a plurality of projections.

The substrate 110 has the shape of a flat plate. The upper surface of the substrate 110 is substantially parallel to the X direction and the Y direction. In the case in which the upper surface of the substrate has a plurality of projections, the portion of the upper surface of the substrate not provided with the projections is substantially parallel to the X direction and the Y direction. As shown in FIG. 1, the substrate 110 has a rectangular shape in a top view in the present embodiment. Two of the four sides constituting the outline of the substrate 110 are substantially parallel to the X direction, and the other two sides are substantially parallel to the Y direction in a top view. The shape of the substrate is not limited to the above shape but can be, for example, a polygonal shape such as a triangular shape and a hexagonal shape. The term "substantially parallel" as used herein indicates that misalignments of about 5° are acceptable.

The semiconductor layered body 120 is disposed on the upper surface of the substrate 110 as shown in FIG. 2 and FIG. 3. A semiconductor such as $In_XAl_YGa_{1-X-Y}N$ ($0 \leq X$, $0 \leq Y$, and $X+Y<1$) is suitably used for the semiconductor layered body 120. The semiconductor layered body 120 includes a first semiconductor layer 121 of a first conduction type disposed on the substrate 110, an active layer 122 disposed on the first semiconductor layer 121, and a second semiconductor layer 123 of a second conduction type disposed on the active layer 122.

Figure 4:
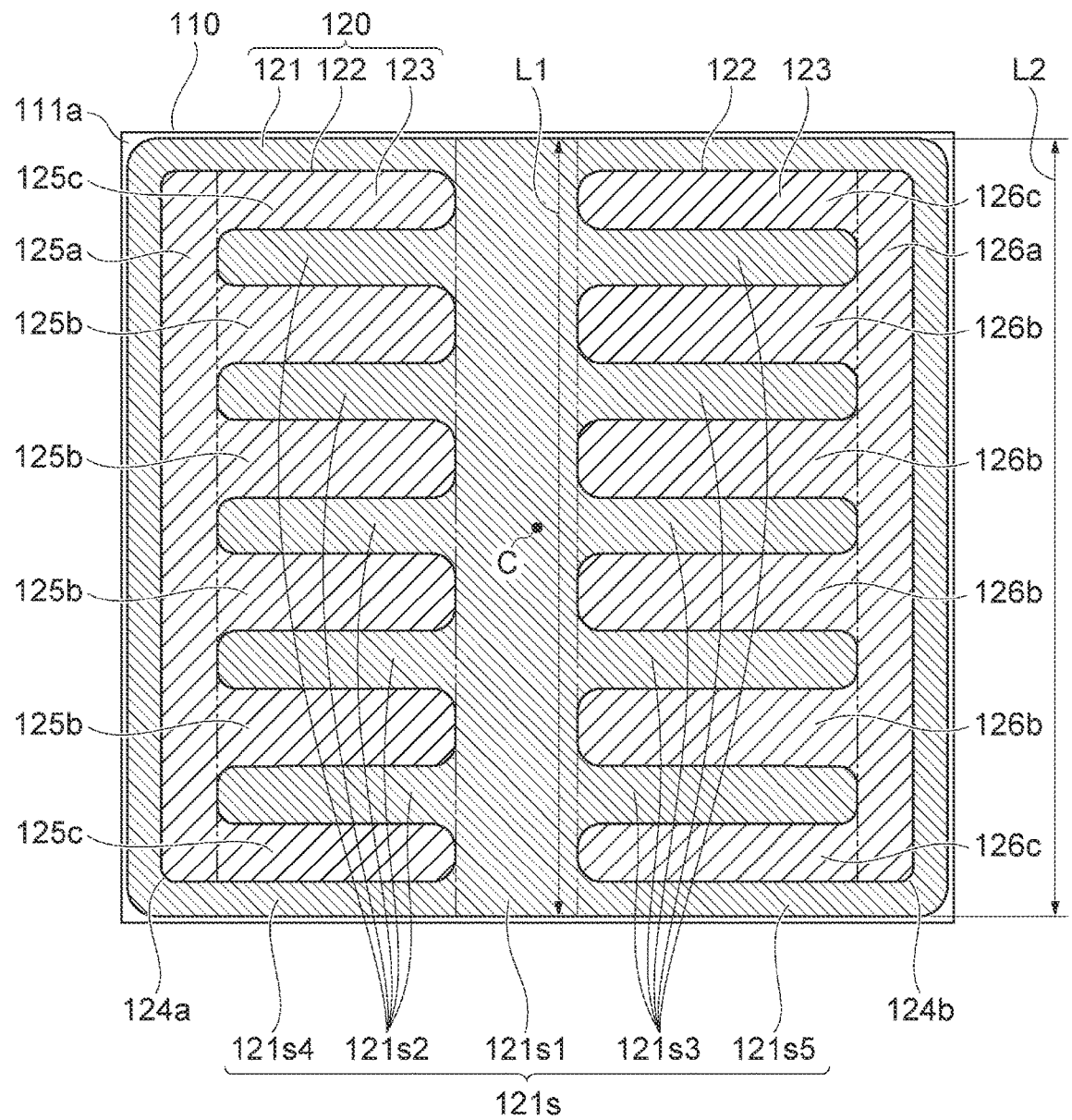
FIG. 4 is a schematic top view of a substrate and a semiconductor layered body of the light-emitting element according to the first embodiment.

FIG. 4 is a schematic top view of the substrate and the semiconductor layered body of the light-emitting element according to the present embodiment.

As for the first semiconductor layer 121, a region exposed from the active layer 122 and the second semiconductor layer 123 and a region in which the second semiconductor layer 123 is disposed in a top view are indicated by different types of oblique hatching for ease of understanding in FIG. 4.

For example, the first semiconductor layer 121 is an n-type semiconductor layer. The first semiconductor layer 121 covers substantially the entire region of the upper surface of the substrate 110 except for an outline region 111a. In the present embodiment, the first semiconductor layer 121 has a substantially rectangular shape in a top view.

The active layer 122 is located on the first semiconductor layer 121. The active layer 122 covers substantially the entire portion of the upper surface of the first semiconductor layer 121 except for a portion 121s. The portion 121s of the upper surface of the first semiconductor layer 121 is a surface in the upper surface of the first semiconductor layer 121 exposed from the active layer 122 and the second semiconductor layer 123.

For example, the second semiconductor layer 123 is a p-type semiconductor layer. The second semiconductor layer 123 is located on the active layer 122. The second semiconductor layer 123 covers substantially the entire upper surface of the active layer 122. In other words, the second semiconductor layer 123 and the active layer 122 have substantially the same shape in a top view, and the portion 121s of the upper surface of the first semiconductor layer 121 is exposed from both the active layer 122 and the second semiconductor layer 123.

In the present embodiment, the portion 121s of the first semiconductor layer 121 includes a first region 121s1 and a plurality of second regions 121s2 in a top view. The portion 121s of the first semiconductor layer 121 may include a plurality of third regions 121s3 and two fourth regions 121s4 and 121s5 in a top view.

The first region 121s1 extends in a first direction D1 parallel to the upper surface of the substrate 110. The first direction D1 is the same as the Y direction in the present embodiment. The first direction may differ from the Y direction. For example, the first direction may intersect the X direction and the Y direction. The first region 121s1 includes a center C of the first semiconductor layer 121 in a top view in the present embodiment. In the case in which the first semiconductor layer has a quadrangular shape in a top view as in the present embodiment, the center C is located on the intersection point of the diagonals of the outline of the first semiconductor layer 121 in a top view. In the case in which the first semiconductor layer has a trapezoidal shape, the center of the first semiconductor layer can be the center of gravity of the trapezoidal shape. In the case in which the first semiconductor layer has a regular polygonal shape or a triangular shape in a top view, the center of the first semiconductor layer is located at the center of the inscribed circle of the regular polygonal shape or the triangular shape.

A length L1 of the first region 121s1 in the first direction D1 is equal to a length L2 of the semiconductor layered body 120 in the first direction D1 in the present embodiment. In a second embodiment described below, the length L1 differs from the length L2, and the length L1 is 60% or more of the length L2. Further, in a third embodiment described below, the length L1 is equal to the length L2. Accordingly, in the first embodiment, the second embodiment, and the third embodiment, the length L1 is 60% or more and 100% or less of the length L2.

Each second region 121s2 extends from the first region 121s1 in a second direction D2 intersecting the first direction D1. In the present embodiment, the second direction D2 is the −X direction. For example, each of a plurality of second regions 121s2 preferably extends from the first region 121s1 orthogonally to the first direction D1. For example, a plurality of second regions 121s2 are preferably arranged at substantially uniform intervals in the first direction D1. With the second regions 121s2 disposed as described above, variations in the current density distribution can be reduced. The term "substantially uniform intervals" as used herein indicates that variations in intervals of 1 µm or less are acceptable.

The statement "the second region extends in the second direction" as used in the present specification indicates that the second region at least partially extends in the second direction. Accordingly, the whole of each second region does not necessarily extend in the second direction as long as a portion extends in the second direction. Specifically, for example, in the case in which the first semiconductor layer has a rectangular shape in a top view, the first semiconductor layer may include a second region that extends toward a corner of the first semiconductor layer as a whole. In this case, the second region extends in a direction intersecting the first direction and the second direction as a whole but partially extends in the second direction. The first semiconductor layer includes such a second region, which allows for easily spreading a current to the corners of the first semiconductor layer. The direction in which one second region extends as a whole may be the same as or different from the direction in which another second region extends as a whole. For example, the first semiconductor layer may include one second region extending in the second direction as a whole and another second region extending in a direction intersecting the first direction and the second direction as a whole.

The width in the first direction of an end of the second region on the first region side may be different from the width in the first direction of an end of the second region on the second direction side. For example, the width of the second region in the first direction may decrease toward the second direction. With such a structure, the area of the active layer can be broadened.

Similarly, each third region 121s3 extends from the first region 121s1 in a third direction D3 intersecting the first direction D1. The third direction D3 is the +X direction in the present embodiment. For example, each of a plurality of third regions 121s3 preferably extends orthogonally to the first direction D1. For example, a plurality of third regions 121s3 are preferably arranged at substantially uniform intervals in the first direction D1. With the third regions 121s3 disposed as described above, variations in the current density distribution can be reduced.

The statement "the third region extends in the third direction" as used in the present specification indicates that the third region at least partially extends in the third direction. Accordingly, the whole of each third region does not necessarily extend in the third direction as long as a portion extends in the third direction. Specifically, for example, in the case in which the first semiconductor layer has a rectangular shape in a top view, the first semiconductor layer may include a third region that extends toward a corner of the first semiconductor layer as a whole. In this case, the third region extends in a direction intersecting the first direction and the third direction as a whole but partially extends in the third direction. The first semiconductor layer includes such a third region, which allows for easily spreading a current to the corners of the first semiconductor layer. The direction in which one third region extends as a whole may be the same as or different from the direction in which another third region extends as a whole. For example, the first semiconductor layer may include one third region extending in the third direction as a whole and another third region extending in a direction intersecting the first direction and the third direction as a whole.

The width in the first direction of an end of the third region on the first region side may be different from the width in the first direction of an end of the third region on the third direction side. For example, the width of the third region in the first direction may decrease toward the third direction. With such a structure, the area of the active layer can be broadened.

The number of the second regions 121s2 is equal to the number of the third regions 121s3 in the present embodiment. With the number of the second regions 121s2 equal to the number of the third regions 121s3, variations in the current density distribution can be reduced. The number of the second regions may be different from the number of the third regions. The number of the second regions and the number of the third regions are not limited to the numbers above as long as each number is two or more. The arrangement of the second regions 121s2 and the third regions 121s3 is preferably symmetric in a top view. With such an arrangement of the second regions 121s2 and the third regions 121s3, variations in the current density distribution can be reduced.

The two fourth regions 121s4 and 121s5 are each continuous with the first region 121s1 and extend along the outline region 111a of the substrate 110. Specifically, the one fourth region 121s4 includes a first portion extending from the end in the +Y direction of the first region 121s1 toward the −X direction, a second portion extending from the end in the −X direction of the first portion toward the −Y direction, and a third portion extending from the end in the −Y direction of the second portion toward the +X direction to be continuous with the end of the first region 121s1 in the −Y direction. The other fourth region 121s5 includes a first portion extending from the end in the +Y direction of the first region 121s1 toward the +X direction, a second portion extending from the end in the +X direction of the first portion toward the −Y direction, and a third portion extending from the end in the −Y direction of the second portion toward the −X direction to be continuous with the end of the first region 121s1 in the Y− direction.

As described above, the portion 121s of the first semiconductor layer 121 preferably includes a plurality of second regions 121s2 and a plurality of third regions 121s3. The shape of the portion of the first semiconductor layer exposed from the active layer and the second semiconductor layer is not limited to the above shapes. For example, the portion of the first semiconductor layer may include only the first region and a plurality of second regions. Alternatively, for example, the portion of the first semiconductor layer may include only the first region and a plurality of third regions extending in the third direction.

These regions 121s1, 121s2, 121s3, 121s4, and 121s5 of the upper surface of the first semiconductor layer 121 exposed from the active layer 122 and the second semiconductor layer 123 are located below the regions of the upper surface of the first semiconductor layer 121 covered with the active layer 122 and the second semiconductor layer 123 as shown in FIG. 2. For example, these regions 121s1, 121s2, 121s3, 121s4, and 121s5 are formed by forming the active layer 122 and the second semiconductor layer 123 over substantially the entire upper surface of the first semiconductor layer 121 and then removing a portion of the first semiconductor layer 121, a portion of the active layer 122, and a portion of the second semiconductor layer 123.

As shown in FIG. 4, in the present embodiment, the active layer 122 and the second semiconductor layer 123 each include two regions 124a and 124b separated from each other by the first region 121s1. The length L1 of the first region 121s1 in the first direction D1 is equal to the length L2 of the semiconductor layered body 120 in the first direction D1 in the present embodiment as described above, so that the active layer 122 and the second semiconductor layer 123 are divided by the first region 121s1.

The one region 124a includes a first extending region 125a extending in the first direction D1, a plurality of intermediate regions 125b continuous with the first extending region 125a and located between the second regions 121s2 adjacent to each other, and two second extending regions 125c continuous with the first extending region 125a and located on both sides of the second regions 121s2 in the Y direction in a top view. Similarly, the other region 124b includes a first extending region 126a extending in the first direction D1, a plurality of intermediate regions 126b continuous with the first extending region 126a and located between the third regions 121s3 adjacent to each other, and two second extending regions 126c continuous with the first extending region 126a and located on both sides of the third regions 121s3 in the Y direction in a top view. Accordingly, the active layer 122 located between a plurality of second regions 121s2, that is, each intermediate region 125b of the active layer 122, overlaps with the intermediate region 125b of the second semiconductor layer 123 in a top view. Similarly, the active layer 122 located between a plurality of third regions 121s3, that is, each intermediate region 126b of the active layer 122, overlaps with the intermediate region 126b of the second semiconductor layer 123 in a top view.

As shown in FIG. 2 and FIG. 3, the first electrode 130 is disposed on the portion 121s of the first semiconductor layer 121. The first electrode 130 is electrically connected to the first semiconductor layer 121.

Figure 5:
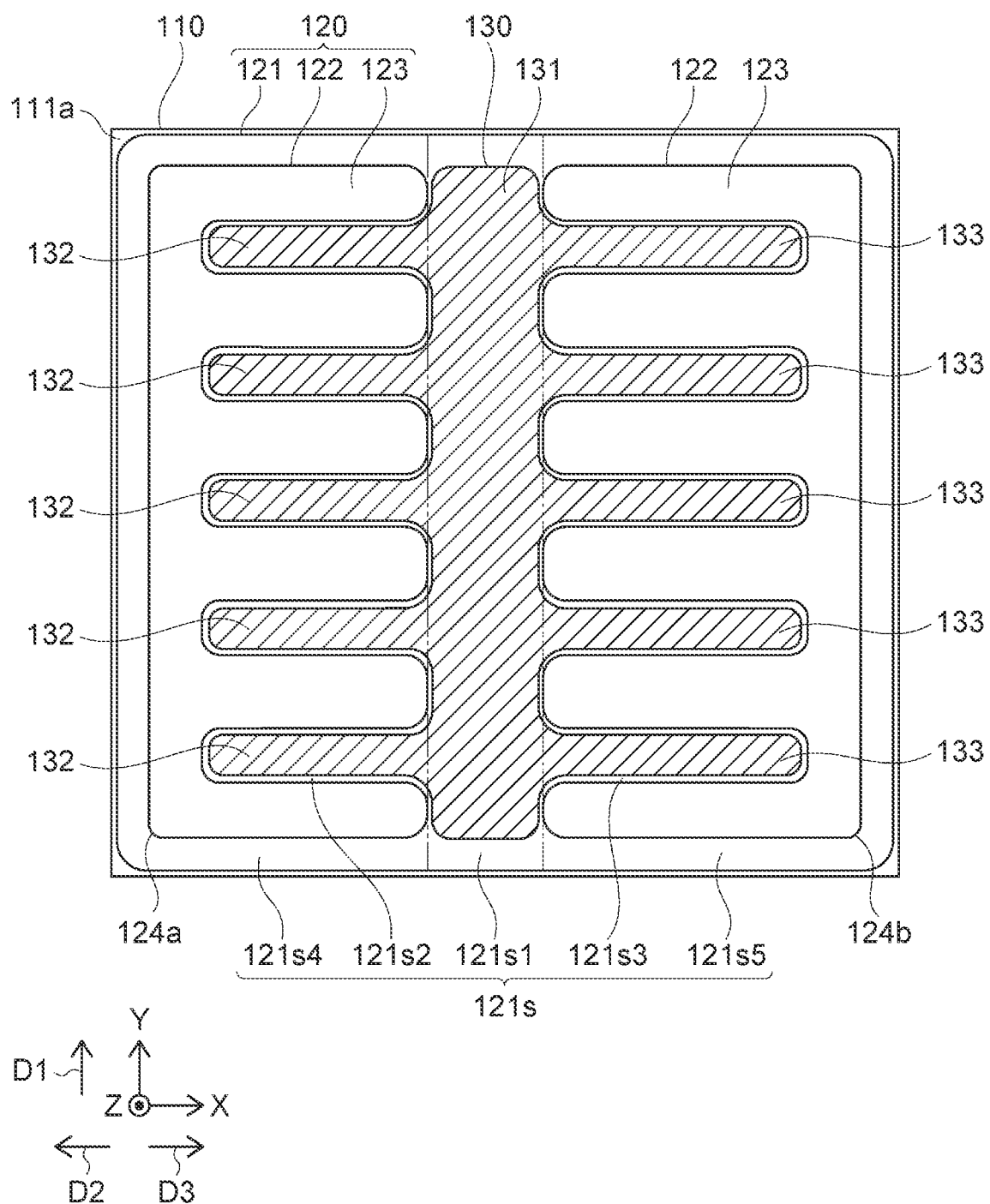
FIG. 5 is a schematic top view of the substrate, the semiconductor layered body, and a first electrode of the light-emitting element according to the first embodiment.

FIG. 5 is a schematic top view of the substrate, the semiconductor layered body, and the first electrode of the light-emitting element according to the present embodiment.

In FIG. 5, the region in which the first electrode 130 is disposed is indicated by oblique hatching for ease of understanding.

The first electrode 130 is made of an electroconductive material such as metal. Examples of the metal used for the first electrode 130 include aluminum (Al), titanium (Ti), and ruthenium (Ru).

The first electrode 130 may be made of one of these metals, may have a structure in which these metals are layered, or may be made of an alloy containing these metals.

The first electrode 130 is disposed on the first region 121s1, a plurality of second regions 121s2, and a plurality of third regions 121s3 of the first semiconductor layer 121 and in contact with the regions 121s1, 121s2, and 121s3 in the present embodiment. The first electrode 130 is spaced apart from the active layer 122 and the second semiconductor layer 123. The first electrode 130 is not disposed on the two fourth regions 121s4 and 121s5 in the present embodiment.

Specifically, the first electrode 130 includes a first extending portion 131 lying on the first region 121s1 and extending in the first direction D1, a plurality of second extending portions 132 extending from the first extending portion 131 in the second direction D2 and respectively lying on the second regions 121s2, and a plurality of third extending portions 133 extending from the first extending portion 131 in the third direction D3 and respectively lying on the third regions 121s3. The first extending portion 131 protrudes in the +Y direction beyond the outermost second extending portion 132 and third extending portion 133 in the +Y direction in the present embodiment. The first extending portion 131 protrudes in the −Y direction beyond the outermost second extending portion 132 and third extending portion 133 in the −Y direction in the present embodiment. The first extending portion 131 is located inside the outline of the first semiconductor layer 121 in a top view.

The shape of the first electrode is not limited to the above shape. For example, the first extending portion of the first electrode does not necessarily protrude in the +Y direction beyond the outermost second extending portion and third extending portion in the +Y direction. In other words, the end of the first extending portion of the first electrode in the +Y direction may be located on the extension line of the outermost second extending portion and third extending portion in the +Y direction or may be recessed in the −Y direction from the outermost second extending portion and third extending portion in the +Y direction. The first extending portion of the first electrode does not necessarily protrude in the −Y direction beyond the outermost second extending portion and third extending portion in the −Y direction. In other words, the end of the first extending portion of the first electrode in the −Y direction may be located on the extension line of the outermost second extending portion and third extending portion in the −Y direction or may be recessed in the +Y direction from the outermost second extending portion and third extending portion in the −Y direction.

As shown in FIG. 2 and FIG. 3, the second semiconductor layer 123, the active layer 122, the portion 121s of the first semiconductor layer 121, and the first electrode 130 are covered with the insulating layer 140.

Figure 6:
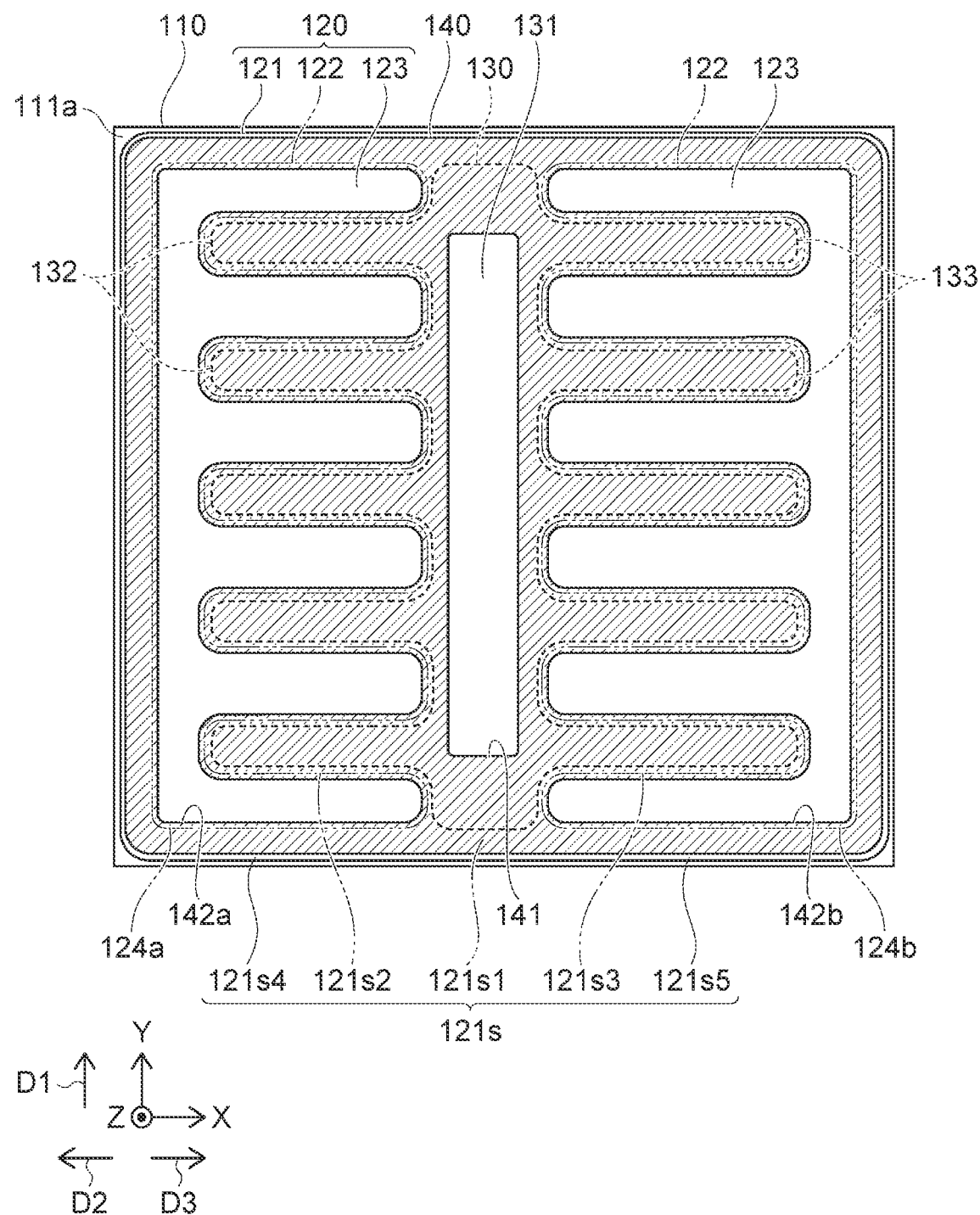
FIG. 6 is a schematic top view of the substrate, the semiconductor layered body, the first electrode, and an insulating layer of the light-emitting element according to the first embodiment.

FIG. 6 is a schematic top view of the substrate, the semiconductor layered body, the first electrode, and the insulating layer of the light-emitting element according to the present embodiment.

In FIG. 6, the region in which the insulating layer 140 is disposed is indicated by oblique hatching for ease of understanding.

The insulating layer 140 is made of an insulating material. Examples of the insulating material used for the insulating layer 140 include silicon oxide ($SiO_2$) and silicon nitride (SiN).

The shape of the outline of the insulating layer 140 in a top view is substantially similar to the shape of the first semiconductor layer 121.

The insulating layer 140 has an opening 141 (corresponding to a third opening) over the first region 121s1 and the first extending portion 131 of the first electrode 130. In this structure, the first extending portion 131 is exposed from the insulating layer 140. The position of the opening is not limited to the above position. For example, the opening may be located over the second extending portions. The opening 141 has a substantially rectangular shape in a top view in which the longitudinal direction is the first direction D1. The shape of the opening is not limited to the above shape.

The insulating layer 140 has two openings 142a and 142b (corresponding to fourth openings) over the second semiconductor layer 123. Each of the openings 142a and 142b overlaps with the active layer 122 located between a plurality of second regions 121s2 or a plurality of third regions 121s3 in a top view in the present embodiment. Specifically, the one opening 142a is located over the one region 124a of the active layer 122 and the second semiconductor layer 123. The shape of the one opening 142a in a top view is substantially similar to the shape of the one region 124a and smaller than the one region 124a. In this structure, a portion other than the outline portion of the one region 124a of the second semiconductor layer 123 is exposed from the insulating layer 140. Similarly, the other opening 142b is located over the other region 124b of the active layer 122 and the second semiconductor layer 123. The shape of the other opening 142b in a top view is substantially similar to the shape of the other region 124b and smaller than the other region 124b. In this structure, a portion other than the outline portion of the other region 124b of the second semiconductor layer 123 is exposed from the insulating layer 140.

The insulating layer 140 continuously covers a portion of the first region 121s1 of the first semiconductor layer 121, the entire region of each second region 121s2, the entire region of each third region 121s3, a portion of each of the fourth regions 121s4 and 121s5, and the outline portion of each of the regions 124a and 124b of the active layer 122 and the second semiconductor layer 123. Accordingly, as shown in FIG. 2 and FIG. 3, the insulating layer 140 is disposed between the active layer 122 and the first electrode 130 and between the second semiconductor layer 123 and the first electrode 130, and lateral surfaces of the active layer 122 and lateral surfaces of the second semiconductor layer 123 are covered with the insulating layer 140.

Figure 7:
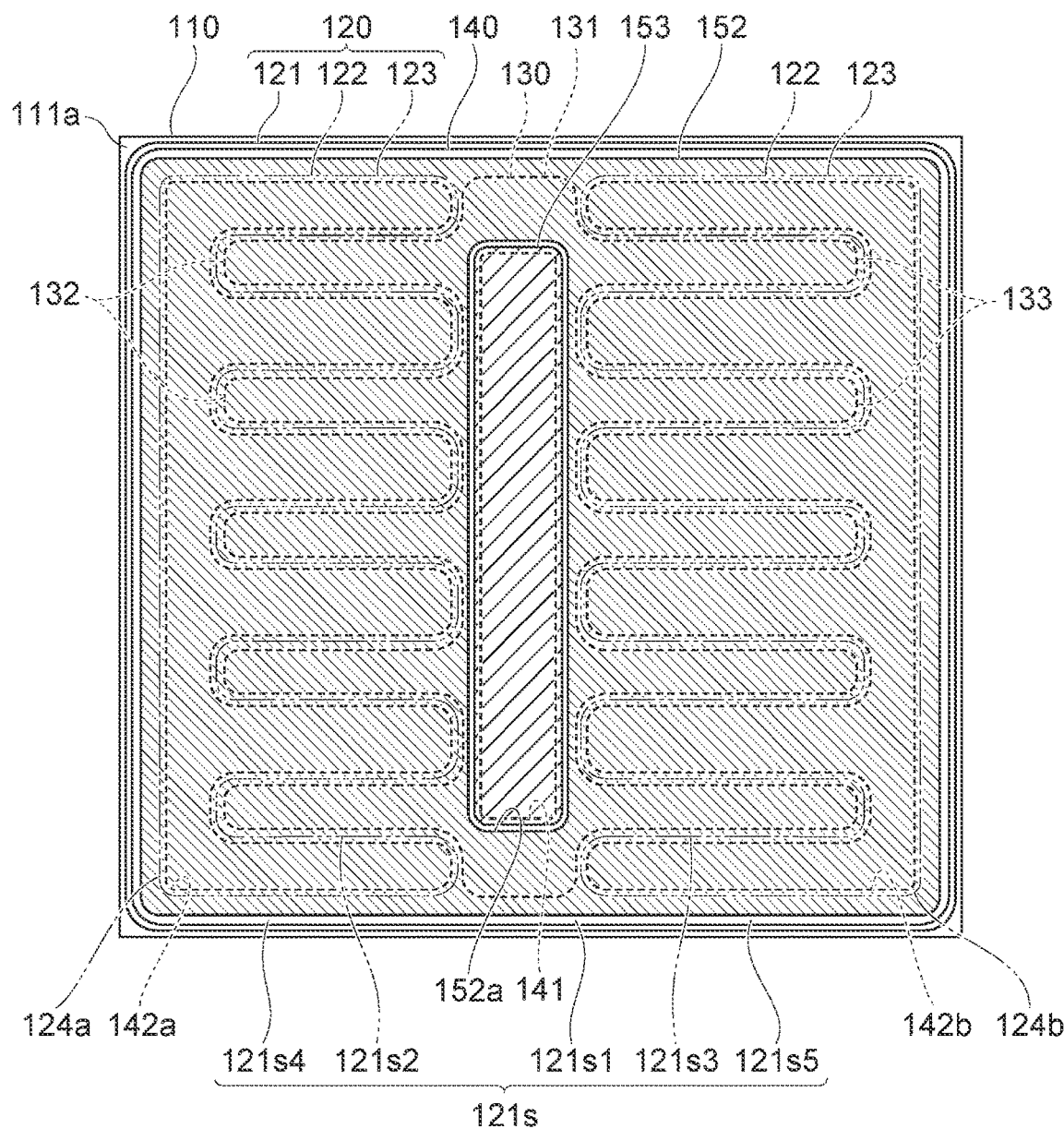
FIG. 7 is a schematic top view of the substrate, the semiconductor layered body, the first electrode, the insulating layer, a second electrode, and a third electrode of the light-emitting element according to the first embodiment.

FIG. 7 is a schematic top view of the substrate, the semiconductor layered body, the first electrode, the insulating layer, the second electrode, and the third electrode of the light-emitting element according to the present embodiment.

In FIG. 7, the regions in which the second electrode 152 and the third electrode 153 are disposed are indicated by different types of oblique hatching for ease of understanding.

The second electrode 152 is made of an electroconductive material such as metal. Examples of the metal used for the second electrode 152 include a metal having a relatively high light reflectivity such as rhodium (Rh), nickel (Ni), gold (Au), silver (Ag), and titanium (Ti). The second electrode 152 may be made of one of these metals, may have a structure in which these metals are layered, or may be made of an alloy containing these metals. The second electrode 152 is disposed over the second semiconductor layer 123 and the insulating layer 140 and electrically connected to the second semiconductor layer 123 through the openings 142a and 142b. In the case in which the second electrode 152 has a layered structure of metal, for example, the light extraction efficiency can be improved by disposing a metal such as Rh and Ag, which has a relatively high light reflectivity among the above metals, on the side of the second semiconductor layer 123 and the insulating layer 140.

Specifically, the shape of the outline of the second electrode 152 in a top view is substantially similar to the shape of the outline of the insulating layer 140 in a top view, and the outline of the second electrode 152 is located inside the outline of the insulating layer 140.

The second electrode 152 has an opening 152a over the opening 141 of the insulating layer 140. The shape of the opening 152a is substantially similar to the shape of the opening 141. The opening 152a is larger than the opening 141. In this structure, the first extending portion 131 of the first electrode 130 and the portion of the insulating layer 140 around the opening 141 are exposed from the second electrode 152. The shape of the opening of the second electrode is not limited to the above shape.

The second electrode 152 continuously covers the insulating layer 140, the openings 142a and 142b of the insulating layer 140, and the first electrode 130 in a top view. Specifically, the second electrode 152 continuously covers the two openings 142a and 142b and substantially the entire region except for the outline portion and the portion around the opening 141 of the insulating layer 140. Accordingly, the second electrode 152 covers the portion of the first extending portion 131 of the first electrode 130 except for the portion overlapping with the opening 141 in a top view, the entire region of each second extending portion 132, and the entire region of each third extending portion 133 with the insulating layer 140 therebetween. The second electrode 152 is in contact with the regions of the second semiconductor layer 123 exposed from the insulating layer 140 in the openings 142a and 142b as shown in FIG. 2.

The third electrode 153 is made of an electroconductive material. Similarly to the second electrode 152, the third electrode 153 preferably contains a metal material having a relatively high light reflectivity. The third electrode 153 is disposed on the insulating layer 140 and electrically connected to the first electrode 130 through the opening 141 of the insulating layer 140.

Specifically, the third electrode 153 is disposed in the opening 152a of the second electrode 152. The shape of the third electrode 153 is substantially similar to the shapes of the opening 141 of the insulating layer 140 and the opening 152a of the second electrode 152 as shown in FIG. 7. The third electrode 153 is larger than the opening 141 and smaller than the opening 152a. The third electrode 153 is spaced apart from the second electrode 152. The shape of the third electrode is not limited to the above shape.

The third electrode 153 covers the opening 141 and the region around the opening 141 of the insulating layer 140 as shown in FIG. 2. The third electrode 153 is in contact with the region of the first extending portion 131 of the first electrode 130 exposed from the insulating layer 140 in the opening 141.

Figure 8:
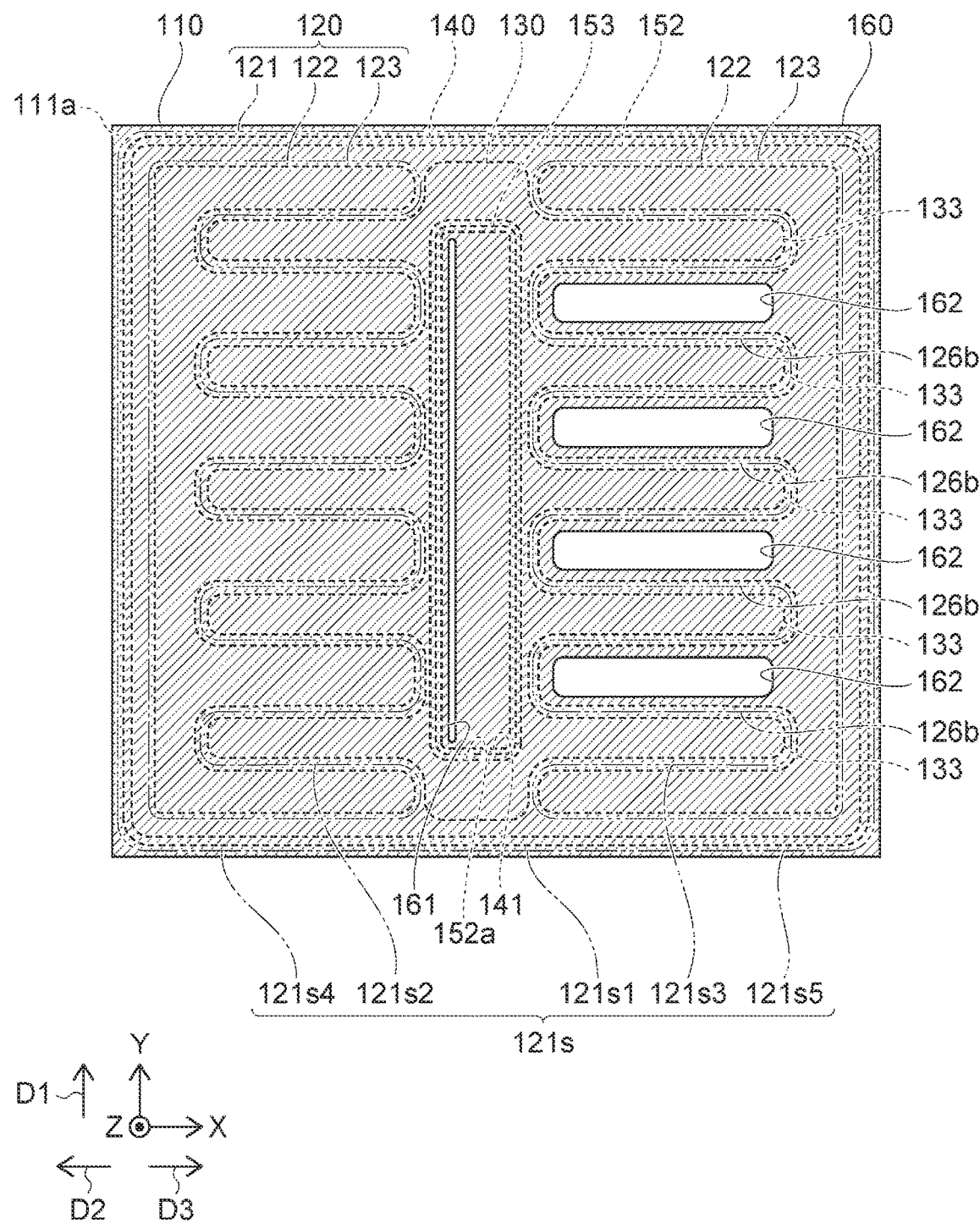
FIG. 8 is a schematic top view of the substrate, the semiconductor layered body, the first electrode, the insulating layer, the second electrode, the third electrode, and another insulating layer of the light-emitting element according to the first embodiment.

FIG. 8 is a schematic top view of the substrate, the semiconductor layered body, the first electrode, the insulating layer, the second electrode, the third electrode, and another insulating layer of the light-emitting element according to the present embodiment.

In FIG. 8, the region in which the insulating layer 160 is disposed is indicated by oblique hatching for ease of understanding.

Similar to the insulating layer 140, the material of the insulating layer 160 is an insulating material. The shape of the outline of the insulating layer 160 in a top view is substantially the same as the shape of the substrate 110.

The insulating layer 160 has an opening 161 (corresponding to a first opening) over the first electrode 130. The opening 161 is located over the first region 121s1 of the first semiconductor layer 121. Specifically, the opening 161 is located over the end of the third electrode 153 in the −X direction and extends in the Y direction. In this structure, a portion of the third electrode 153 is exposed from the insulating layer 160. The shape and position of the opening are not limited to the above shape and position.

The insulating layer 160 has a plurality of openings 162 (corresponding to second openings) over the second electrode 152. Specifically, each opening 162 is located over the second electrode 152 and between adjacent third extending portions 133 of the first electrode 130 in a top view. That is, each opening 162 is located over the intermediate region 126b of the second semiconductor layer 123. In this structure, portions of the second electrode 152 are exposed from the insulating layer 160. Each opening 162 has a rectangular shape in which the longitudinal direction is the X direction. The positions and shape of the openings are not limited to the above positions and shape. The openings are located over any of a plurality of intermediate regions of the second semiconductor layer. Accordingly, the number of the openings may be one.

The insulating layer 160 continuously covers the outline region 111a of the upper surface of the substrate 110, the outline portion of the insulating layer 140, the entire portion of the second electrode 152 except for the portions overlapping with the openings 162 in a top view, and the entire portion of the third electrode 153 except for the portion overlapping with the opening 161 in a top view. The insulating layer 160 covers the first electrode 130 with the third electrode 153 and the insulating layer 140 therebetween.

Figure 9:
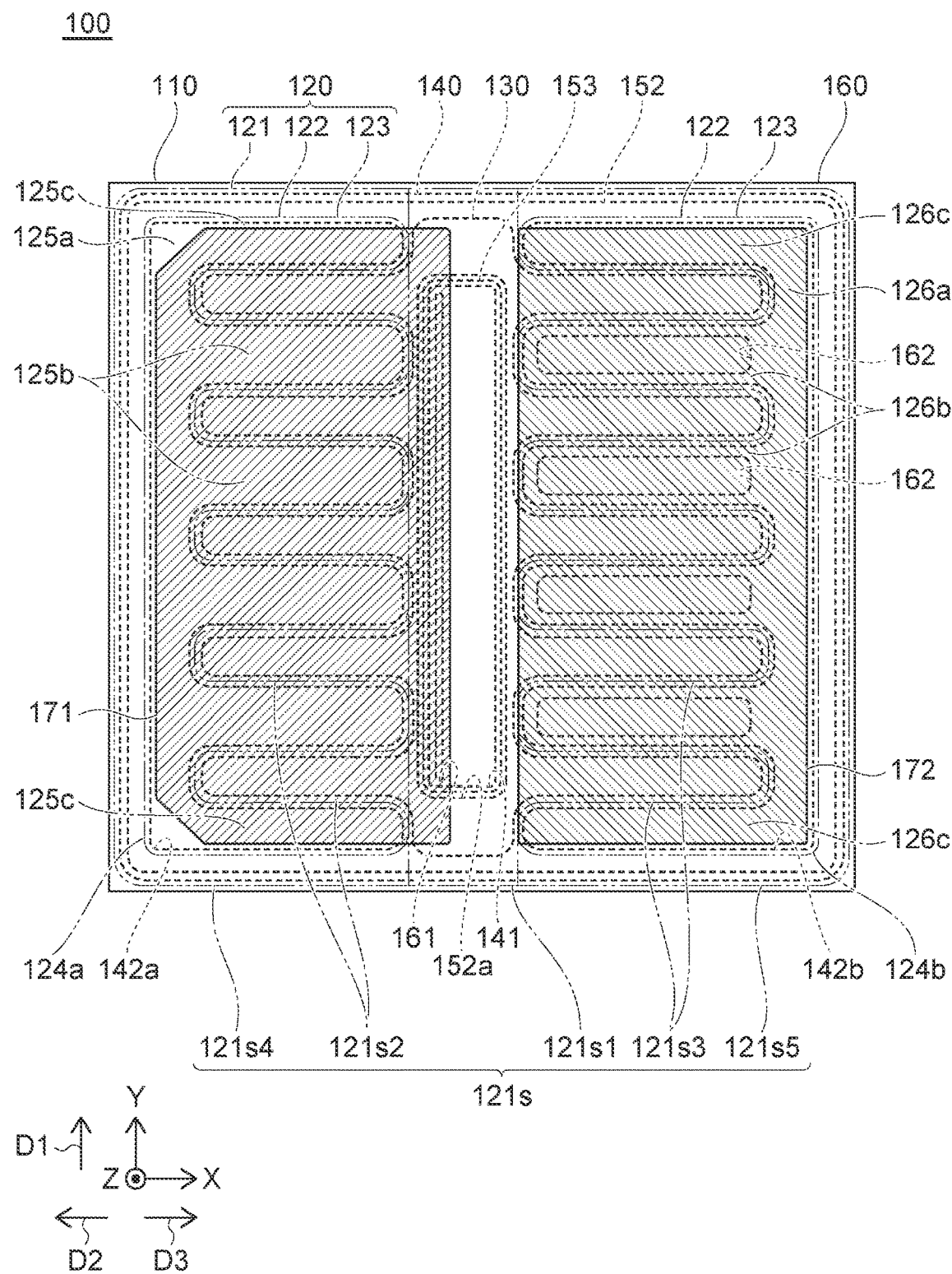
FIG. 9 is a schematic top view of the light-emitting element according to the first embodiment.

FIG. 9 is a schematic top view of the light-emitting element according to the present embodiment.

In FIG. 9, the regions in which the first pad electrode 171 and the second pad electrode 172 are disposed are indicated by oblique hatching for ease of understanding.

The first pad electrode 171 is made of an electroconductive material such as metal. Examples of the metal used for the first pad electrode 171 include nickel (Ni), titanium (Ti), platinum (Pt), copper (Cu), and gold (Au).
The first pad electrode 171 may be made of one of these metals, may have a structure in which these metals are layered, or may be made of an alloy containing these metals. The first pad electrode 171 is disposed on the insulating layer 160 and electrically connected to the first electrode 130 through the opening 161 as shown in FIG. 2 and FIG. 9.

The first pad electrode 171 may have a hexagonal shape in which the longitudinal direction is the Y direction in a top view as shown in FIG. 9. Two of six sides constituting the outline of the first pad electrode 171 are parallel to the X direction, other two sides are parallel to the Y direction, and the remaining two sides are inclined with respect to the X direction and the Y direction in a top view. With such a shape of the first pad electrode 171, the shape is different from the shape of the second pad electrode 172 described below, so that the polarities of the first pad electrode 171 and the second pad electrode 172 can be distinguished by the shape. The shape of the first pad electrode is not limited to the above particular shape.

The first pad electrode 171 continuously covers the active layer 122 located between a plurality of second regions 121s2 of the first semiconductor layer 121 in a top view and a plurality of second regions 121s2. Specifically, the first pad electrode 171 continuously covers a portion of the first extending region 125a of the one region 124a of the active layer 122 and the second semiconductor layer 123, the entire region of each intermediate region 125b, a portion of each second extending region 125c, the entire region of each second region 121s2 of the first semiconductor layer 121, and the opening 161 of the insulating layer 160. The first pad electrode 171 is in contact with the portion of the third electrode 153 exposed from the insulating layer 160 in the opening 161 as shown in FIG. 2.

Similar to the first pad electrode 171, the second pad electrode 172 is made of an electroconductive material such as a metal material. The second pad electrode 172 is disposed on the insulating layer 160 and electrically connected to the second electrode 152 through a plurality of openings 162. The second pad electrode 172 is spaced apart from the first pad electrode 171.

Specifically, the second pad electrode 172 has a rectangular shape in which the longitudinal direction is the Y direction in a top view in the present embodiment. The shape of the second pad electrode is not limited to the above particular shape.

The second pad electrode 172 continuously covers the active layer 122 located between a plurality of third regions 121s3 of the first semiconductor layer 121 in a top view and a plurality of third regions 121s3. Specifically, the second pad electrode 172 covers a portion of the first extending region 126a of the other region 124b of the active layer 122 and the second semiconductor layer 123, the entire region of each intermediate region 126b, and a portion of each second extending region 126c. The second pad electrode 172 is in contact with the portion of the second electrode 152 exposed from the insulating layer 160 in each opening 162 as shown in FIG. 2.

Accordingly, the first region 121s1 of the first semiconductor layer 121 is located between the first pad electrode 171 and the second pad electrode 172 in a top view. The statement "the first region 121s1 of the first semiconductor layer 121 is located between the first pad electrode 171 and the second pad electrode 172 in a top view" as used herein indicates that at least a portion of the first region 121s1 is located between the first pad electrode 171 and the second pad electrode 172. Accordingly, the first pad electrode 171 and the first region 121s1 may partially overlap with each other in a top view as in the present embodiment, or the first pad electrode 171 and the first region 121s1 may not overlap with each other. The second direction D2 is a direction from the first region 121s1 toward the first pad electrode 171 in a top view. The third direction D3 is a direction from the first region 121s1 toward the second pad electrode 172 in a top view.

For example, the first pad electrode 171 and the second pad electrode 172 are bonded to an external mounting substrate with electroconductive bonding members such as solder.

Next, the operation of the light-emitting element 100 according to the present embodiment will be described.

The first pad electrode 171 is electrically connected to the first semiconductor layer 121 via the third electrode 153 and the first electrode 130 as shown in FIG. 2. The second pad electrode 172 is connected to the second semiconductor layer 123 via the second electrode 152. By applying a voltage between the first pad electrode 171 and the second pad electrode 172 using the external mounting substrate, electrons in the first semiconductor layer 121 and holes in the second semiconductor layer 123 recombine in the active layer 122. The active layer 122 thus emits light.

In the light-emitting element 100 according to the present embodiment, the first region 121s1, a plurality of second regions 121s2, and a plurality of third regions 121s3 of the first semiconductor layer 121 are exposed from the active layer 122 and the second semiconductor layer 123. The first electrode 130 is disposed over the first region 121s1, the second regions 121s2, and the third regions 121s3.

Accordingly, electrons can also be supplied from the second regions 121s2 and the third regions 121s3 to a portion of the active layer 122 distant from the first region 121s1. Accordingly, the region in which a current flows in the active layer 122 can be broadened in the present embodiment compared with the case in which a plurality of second regions 121s2 and a plurality of third regions 121s3 are not provided.

On the other hand, in the active layer 122, electrons are likely to be supplied from the first semiconductor layer 121 to each intermediate region 125b located between a plurality of second regions 121s2 and each intermediate region 126b located between a plurality of third regions 121s3 in a top view, so that the recombination is likely to occur. Each of the intermediate regions 125b and 126b of the active layer 122 is likely to generate heat.

On the other hand, in the light-emitting element 100, as shown in FIG. 9, the first pad electrode 171 covers each intermediate region 125b of the active layer 122 in a top view. The second pad electrode 172 covers each intermediate region 126b of the active layer 122 in a top view. Accordingly, heat generated in each of the intermediate regions 125b and 126b of the active layer 122 is likely to be propagated to the first pad electrode 171 or the second pad electrode 172 located directly above. Accordingly, heat generated from each of the intermediate regions 125b and 126b of the active layer 122 can be efficiently dissipated to the outside through the first pad electrode 171 and the second pad electrode 172 located directly above. Generation of heat from the active layer 122 is likely to be great particularly in the case in which the content ratio of aluminum (Al) to gallium (Ga) is large in the semiconductor layered body 120. Accordingly, for example, in the case in which the first semiconductor layer 121 is made of $In_XAl_YGa_{1-X-Y}N$ (0≤X, 0≤Y, and X+Y<1) and Y≥0.5, the first pad electrode 171 preferably covers each intermediate region 125b of the active layer 122 in a top view, and the second pad electrode 172 preferably covers each intermediate region 126b of the active layer 122 in a top view.

Next, the effects of the present embodiment will be described.

In the light-emitting element 100 of the present embodiment, the portion 121s of the first semiconductor layer 121 is exposed from the active layer 122 and the second semiconductor layer 123. The portion 121s of the first semiconductor layer 121 includes the first region 121s1 that is located between the first pad electrode 171 and the second pad electrode 172 and has a length in the first direction D1 parallel to the upper surface of the substrate 110 of 60% or more of the length of the semiconductor layered body 120 in the first direction D1 and a plurality of second regions 121s2 extending from the first region 121s1 in the second direction D2 intersecting the first direction D1, the second direction D2 being the direction from the first region 121s1 to the first pad electrode 171 in a top view. The first electrode 130 is disposed on the first region 121s1 and a plurality of second regions 121s2. The region in which a current flows in the active layer 122 can thus be broadened.

On the other hand, the portions of the active layer 122 located between a plurality of second regions 121s2 are likely to be supplied with electrons and generate heat. However, the first pad electrode 171 covers the active layer 122 located between a plurality of second regions 121s2 in a top view in the present embodiment. Accordingly, heat generated in the active layer 122 is easily dissipated to the outside through the first pad electrode 171 disposed directly above.

With the above structure, the light-emitting element 100 that has a broadened region in which a current flows in the active layer 122 and that exhibits good heat dissipation performance can be provided.

The portion 121s of the first semiconductor layer 121 further includes a plurality of third regions 121s3 extending from the first region 121s1 in the third direction D3 intersecting the first direction D1, the third direction D3 being the direction from the first region 121s1 to the second pad electrode 172 in a top view. The first electrode 130 is further disposed on a plurality of third regions 121s3.

The region in which a current flows in the active layer 122 can thus be further broadened.

On the other hand, the portions of the active layer 122 located between a plurality of third regions 121s3 are likely to be supplied with electrons and generate heat. However, the second pad electrode 172 covers the active layer 122 located between a plurality of third regions 121s3 in a top view in the present embodiment. Accordingly, heat generated in the active layer 122 is easily dissipated through the second pad electrode 172 disposed directly above. The heat dissipation performance of the light-emitting element 100 can thus be enhanced.

The area of the active layer 122 covered with the first pad electrode 171 and the second pad electrode 172 in a top view is 75% or more of the area of the active layer 122 in a top view. By covering a large portion of the active layer 122 with the first pad electrode 171 and the second pad electrode 172, the heat dissipation performance of the light-emitting element 100 can be enhanced.

In the case in which the peak wavelength of light emitted from the active layer 122 is within the ultraviolet to deep ultraviolet range, the active layer 122 is likely to generate heat. Accordingly, in the case in which the peak wavelength of light emitted from the active layer 122 is within the ultraviolet to deep ultraviolet range, the area of the active layer 122 covered with the first pad electrode 171 and the second pad electrode 172 is preferably 80% or more of the area of the active layer 122 in a top view, more preferably 90% or more of the area of the active layer 122 in a top view. The term "ultraviolet range" as used herein refers to, for example, a wavelength of 400 nm or less, and the term "deep ultraviolet range" refers to, for example, a wavelength of 300 nm or less.

The active layer 122 is likely to generate heat in the case in which the content ratio of aluminum (Al) to gallium (Ga) in the semiconductor layered body 120 is large. For example, in the case in which the first semiconductor layer 121 is made of $In_XAl_YGa_{1-X-Y}N$ (0≤X, 0≤Y, and X+Y<1) and Y≥0.5, the active layer 122 is likely to generate heat. Accordingly, in the case in which the semiconductor layered body 120 is made of $In_XAl_YGa_{1-X-Y}N$ and Y≥0.5, the area of the active layer 122 covered with the first pad electrode 171 and the second pad electrode 172 is preferably 80% or more of the area of the active layer 122 in a top view, more preferably 90% or more of the area of the active layer 122 in a top view.

The first pad electrode 171 continuously covers the active layer 122 located between a plurality of second regions 121s2 in a top view and a plurality of second regions 121s2. The second pad electrode 172 continuously covers the active layer 122 located between a plurality of third regions 121s3 in a top view and a plurality of third regions 121s3. Accordingly, heat generated in the intermediate regions 125b of the active layer 122 located between a plurality of second regions 121s2, the intermediate regions 126b of the active layer 122 located between a plurality of third regions 121s3, a plurality of second regions 121s2, and a plurality of third regions 121s3 can be efficiently dissipated to the outside through the first pad electrode 171 or the second pad electrode 172. The heat dissipation performance of the light-emitting element 100 can thus be enhanced.

The second semiconductor layer 123 includes the intermediate regions 126b located between a plurality of third regions 121s3 in a top view. The openings 162 are located over the intermediate regions 126b. Accordingly, heat generated in the intermediate regions 126b that are likely to generate heat is likely to be propagated to the second pad electrode 172 through the second electrode 152 disposed inside the openings 162. The heat dissipation performance of the light-emitting element 100 can thus be enhanced.

The opening 161 is located over the first region 121s1. This structure inhibits electrons from being unevenly supplied from the first semiconductor layer 121 to one of the two regions 124a and 124b of the active layer 122. Variations in the current density distribution in the active layer 122 can thus be reduced.

The first region 121s1 includes the center C of the first semiconductor layer 121 in a top view. As described above, the first region 121s1 is located substantially at the center of the first semiconductor layer 121, and a plurality of second regions 121s2 and a plurality of third regions 121s3 extend from the first region 121s1. Variations in the current density distribution in the active layer 122 can thus be reduced.

The light-emitting element 100 further includes the third electrode 153 disposed between the first electrode 130 and the insulating layer 160, electrically connected to the first electrode 130, and partially exposed from the opening 161 of the insulating layer 160. The first pad electrode 171 is electrically connected to the third electrode 153 through the opening 161. Accordingly, the thickness of the electrode on the first region 121s1 can be greater than in the case in which the third electrode 153 is not provided. The forward voltage can thus be reduced. In the case in which the material of the second electrode 152 is the same as the material of the third electrode 153, the etching rates of the members to be exposed can be uniform when the openings 161 and 162 are formed in the insulating layer 160 by etching. The openings 161 and 162 can thus be easily formed by etching.

The light-emitting element 100 further includes the insulating layer 140 that covers the second semiconductor layer 123, the active layer 122, the portion 121s of the first semiconductor layer 121, and the first electrode 130 and has the opening 141 over the first electrode 130 and the openings 142a and 142b over the second semiconductor layer 123. The third electrode 153 is disposed on the insulating layer 140 and electrically connected to the first electrode 130 through the opening 141. The second electrode 152 is disposed over the insulating layer 140 and electrically connected to the second semiconductor layer 123 through the openings 142a and 142b. Accordingly, the second electrode 152 and the third electrode 153 override the insulating layer 140, and the second electrode 152 and the third electrode 153 have large areas in a top view. Light emitted from the active layer 122 is thus effectively reflected by the second electrode 152 and the third electrode 153, so that the light extraction efficiency of the light-emitting element 100 can be improved.

The openings 142a and 142b overlap with the active layer 122 located between a plurality of second regions 121s2 and the active layer 122 located between a plurality of third regions 121s3 in a top view.

The second electrode 152 continuously covers the insulating layer 140, the openings 142a and 142b, and the first electrode 130 in a top view. Accordingly, the second electrode 152 overrides the insulating layer 140 and overlaps with the first electrode 130 in a top view. The second electrode 152 formed as described above can more efficiently reflect light emitted from the active layer 122, so that the light extraction efficiency of the light-emitting element 100 can be improved.

The active layer 122 includes the two regions 124a and 124b separated from each other by the first region 121s1. Such separation of the active layer 122 can reduce the area of the active layer 122 not covered with the two pad electrodes 171 and 172 in a top view and allows for dissipation of heat generated from the active layer 122 through the two pad electrodes 171 and 172.

Second Embodiment

Next, the second embodiment will be described.

Figure 10:
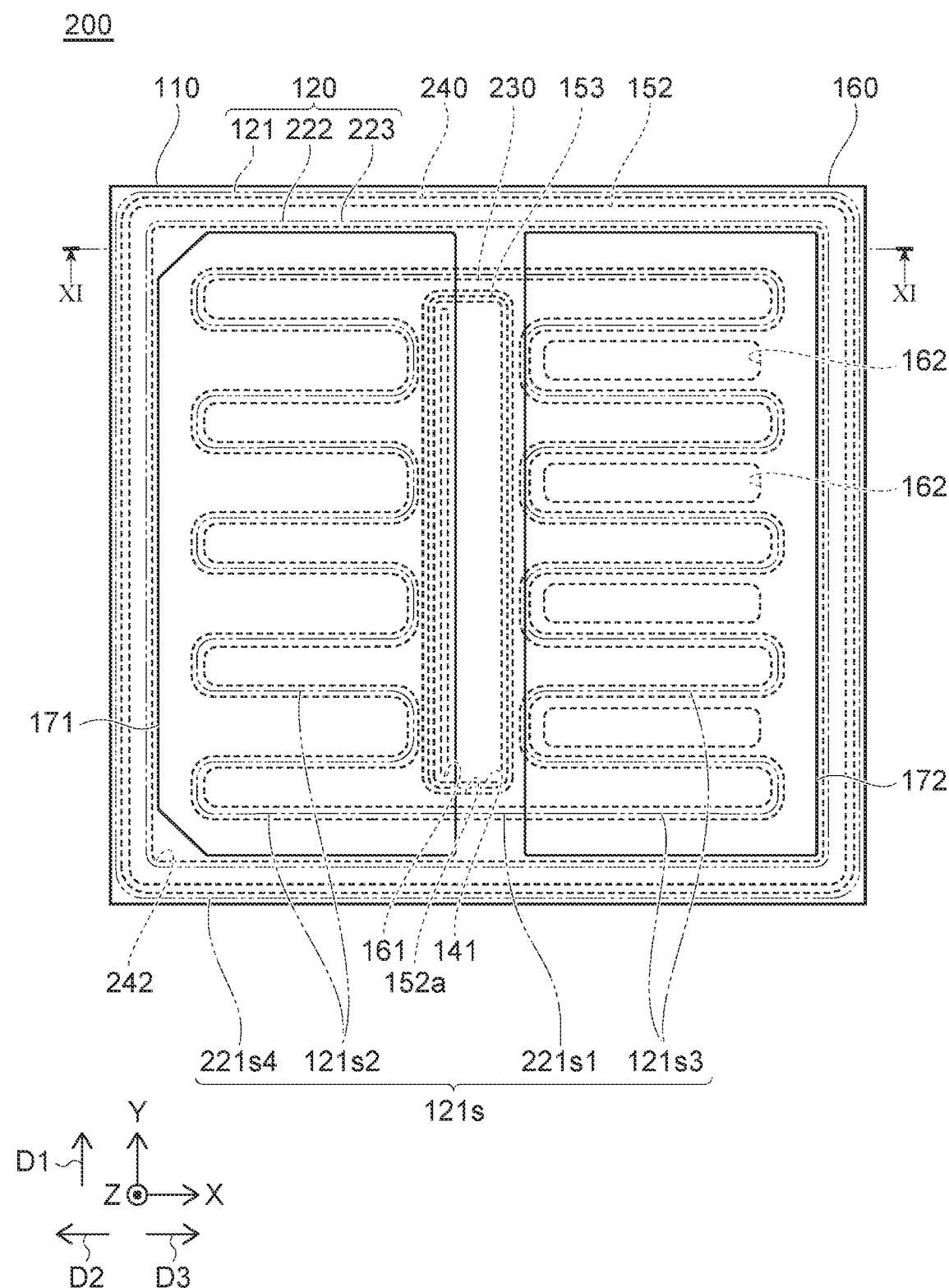
FIG. 10 is a schematic top view of a light-emitting element according to a second embodiment.

FIG. 10 is a schematic top view of a light-emitting element according to the present embodiment.

Figure 11:
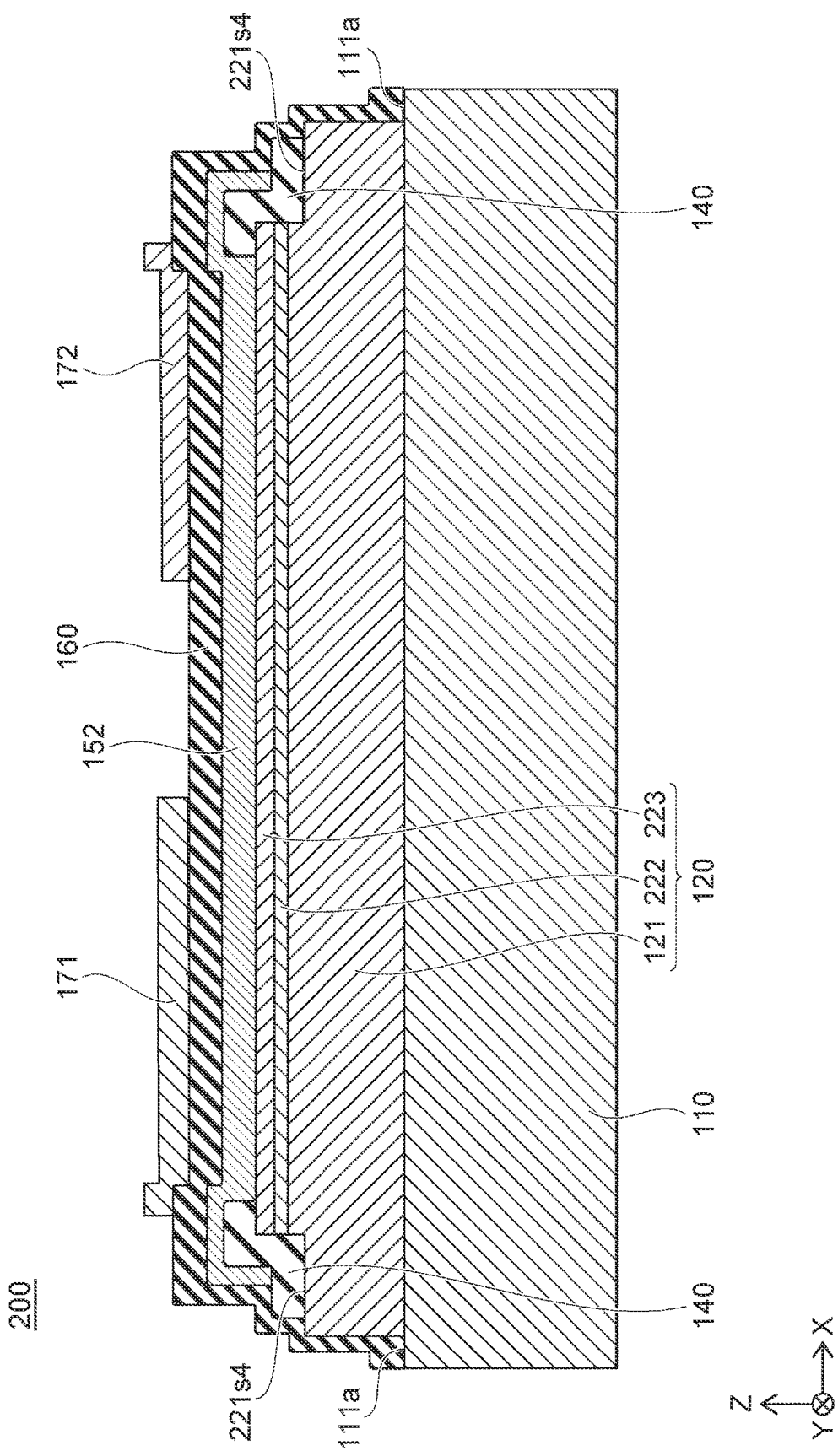
FIG. 11 is a schematic cross-sectional view taken along the line XI-XI of FIG. 10.

FIG. 11 is a schematic cross-sectional view taken along the line XI-XI of FIG. 10.

Figure 12:
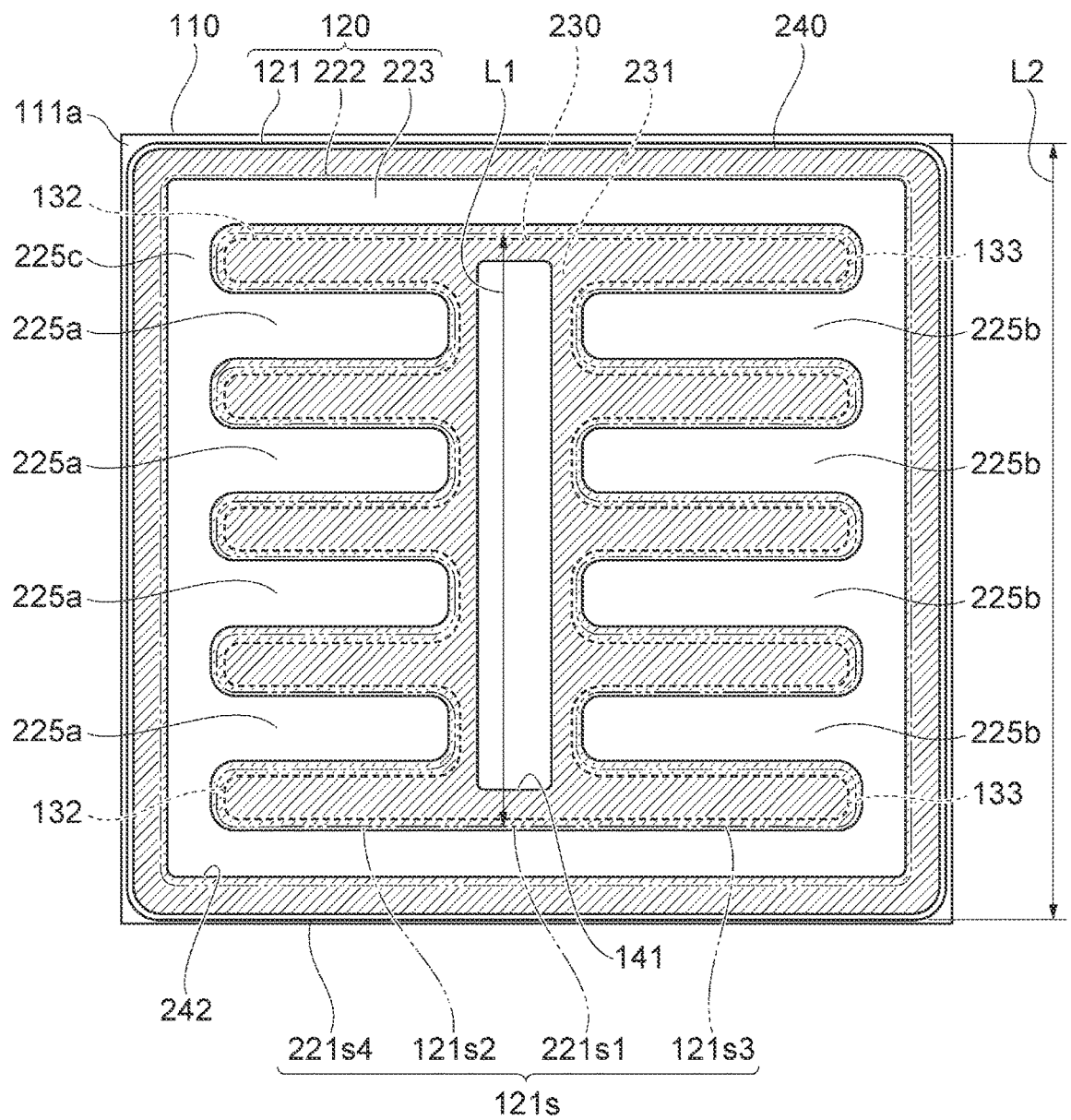
FIG. 12 is a schematic top view of the substrate, the semiconductor layered body, a first electrode, and an insulating layer of the light-emitting element according to the second embodiment.
Figure 12:
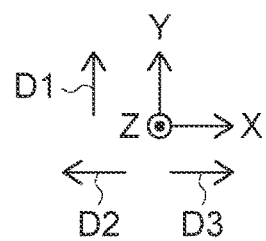

FIG. 12 is a schematic top view of the substrate, the semiconductor layered body, a first electrode, and an insulating layer of the light-emitting element according to the present embodiment.

A light-emitting element 200 according to the present embodiment differs from the light-emitting element 100 according to the first embodiment in that an active layer 222 and a second semiconductor layer 223 continuously surround a first region 221s1, a plurality of second regions 121s2, and a plurality of third regions 121s3 of the first semiconductor layer 121 in a top view.

Only the differences from the first embodiment will be generally described below. Features other than the features described below are substantially the same as in the first embodiment. The same applies to other embodiments described below.

In the present embodiment, the portion 121s of the first semiconductor layer 121 exposed from the active layer 222 and the second semiconductor layer 223 differs from the portion 121s of the first semiconductor layer 121 in the first embodiment in the shape of the first region 221s1 and the shape of a fourth region 221s4. Specifically, both ends in the first direction D1 of the first region 221s1 extending in the first direction D1 do not reach the outline of the semiconductor layered body 120 as shown in FIG. 12. In other words, both ends in the first direction D1 of the first region 221s1 extending in the first direction D1 are spaced apart from the outline of the semiconductor layered body 120. The fourth region 221s4 is spaced apart from the first region 221s1, a plurality of second regions 121s2, and a plurality of third regions 121s3 and surrounds the regions 221s1, 121s2, and 121s3 along the outline region 111a of the substrate 110.

Accordingly, the shapes of the active layer 222 and the second semiconductor layer 223 in the present embodiment also differ from the shapes of the active layer 122 and the second semiconductor layer 123 in the first embodiment. Specifically, the active layer 222 and the second semiconductor layer 223 each have such a shape in which the two regions 124a and 124b in the first embodiment are connected. The active layer 222 and the second semiconductor layer 223 each have a plurality of first intermediate regions 225a, a plurality of second intermediate regions 225b, and an outline region 225c in a top view. Each first intermediate region 225a is located between adjacent second regions 121s2. Each second intermediate region 225b is located between adjacent third regions 121s3. The outline region 225c is continuous with the end of each first intermediate region 225a in the −X direction and the end of each second intermediate region 225b in the +X direction. The outline region 225c surrounds a plurality of first intermediate regions 225a and a plurality of second intermediate regions 225b along the fourth region 221s4.

As described above, in the second embodiment, the length L1 of the first region 221s1 in the first direction D1 is 60% or more of the length L2 of the semiconductor layered body 120 in the first direction D1. In the second embodiment, the length L1 is preferably 70% or more of the length L2, more preferably 80% or more of the length L2.

The above length L1 can reduce the area of the active layer 122 not covered with the two pad electrodes 171 and 172 between the two pad electrodes 171 and 172 in a top view and allows for dissipation of heat generated from the active layer 122 through the two pad electrodes 171 and 172.

In the present embodiment, the shape of a first extending portion 231 of a first electrode 230 also differs from the first extending portion 131 in the first embodiment. Specifically, the first extending portion 231 extending in the first direction D1 does not protrude in the +Y direction beyond the outermost second extending portion 132 and third extending portion 133 in the +Y direction. In other words, the end of the first extending portion 231 of the first electrode 230 in the +Y direction is located on the extension line of the outermost second extending portion 132 and third extending portion 133 in the +Y direction. The first extending portion 231 does not protrude in the −Y direction beyond the outermost second extending portion 132 and third extending portion 133 in the −Y direction. In other words, the end of the first extending portion 231 of the first electrode 230 in the −Y direction is located on the extension line of the outermost second extending portion 132 and third extending portion 133 in the −Y direction.

In the present embodiment, an insulating layer 240 differs from the insulating layer 140 in the first embodiment in that the number of openings 242 in which the second semiconductor layer 123 is exposed is one. The opening 242 has such a shape that the openings 142a and 142b in the first embodiment are connected to each other.

Next, the effects of the present embodiment will be described.

Also in the present embodiment, similarly to the light-emitting element 100 according to the first embodiment, the portion 121s of the first semiconductor layer 121 includes the first region 221s1 and a plurality of second regions 121s2. The first electrode 230 is disposed on the first region 221s1 and a plurality of second regions 121s2. The first pad electrode 171 covers the active layer 222 located between a plurality of second regions 121s2 in a top view. Accordingly, heat generated in the active layer 222 located between a plurality of second regions 121s2 can be easily dissipated through the first pad electrode 171.

In the present embodiment, the active layer 222 surrounds the first region 221s1, a plurality of second regions 121s2, and a plurality of third regions 121s3 in a top view. Accordingly, in the active layer 222, a plurality of first intermediate regions 225a located between a plurality of second regions 121s2 are continuous with a plurality of second intermediate regions 225b located between a plurality of third regions 121s3. Variations in the current density distribution in the active layer 222 can thus be reduced.

Third Embodiment

Next, the third embodiment will be described.

Figure 13:
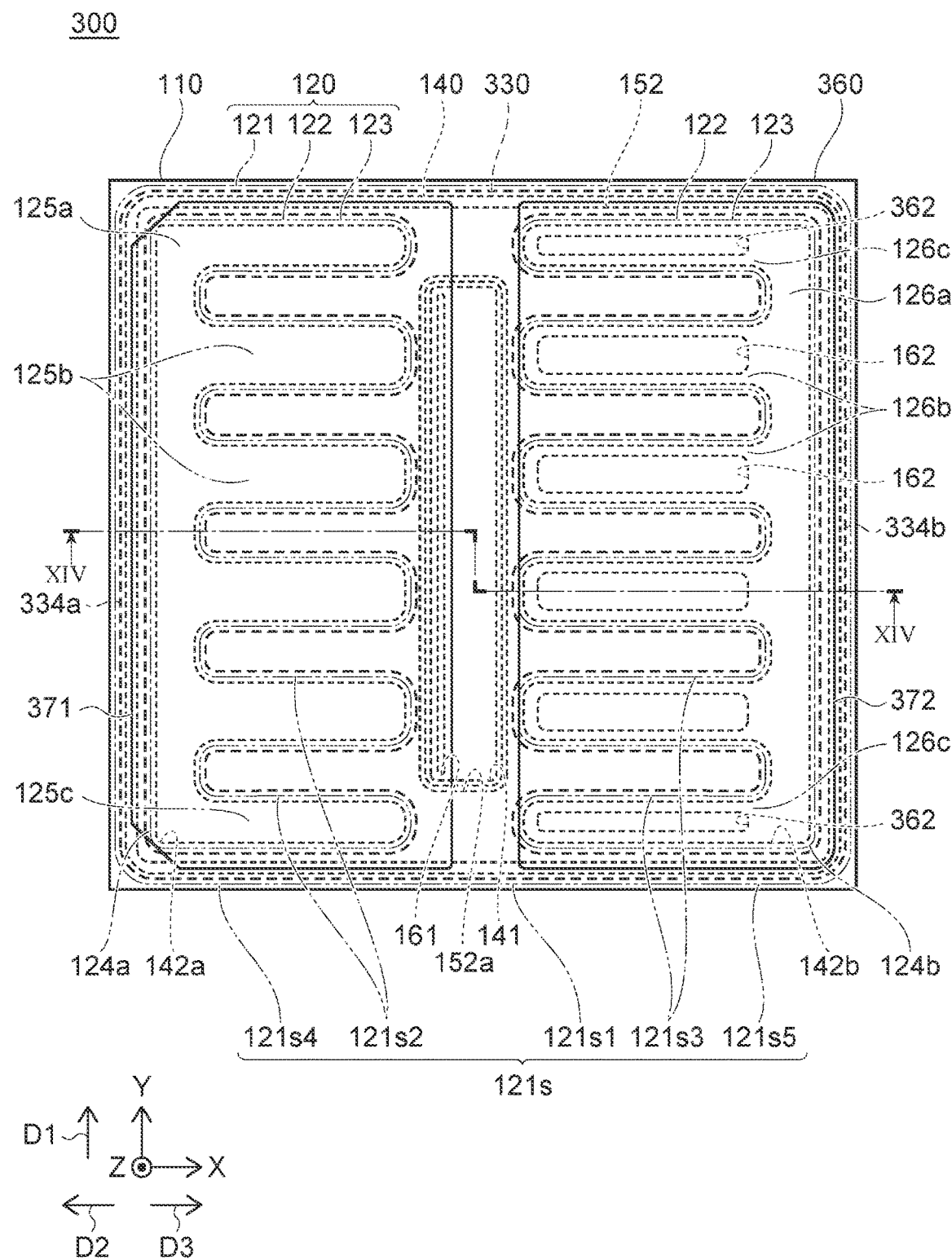
FIG. 13 is a schematic top view of a light-emitting element according to a third embodiment.

FIG. 13 is a schematic top view of a light-emitting element according to the present embodiment.

Figure 14:
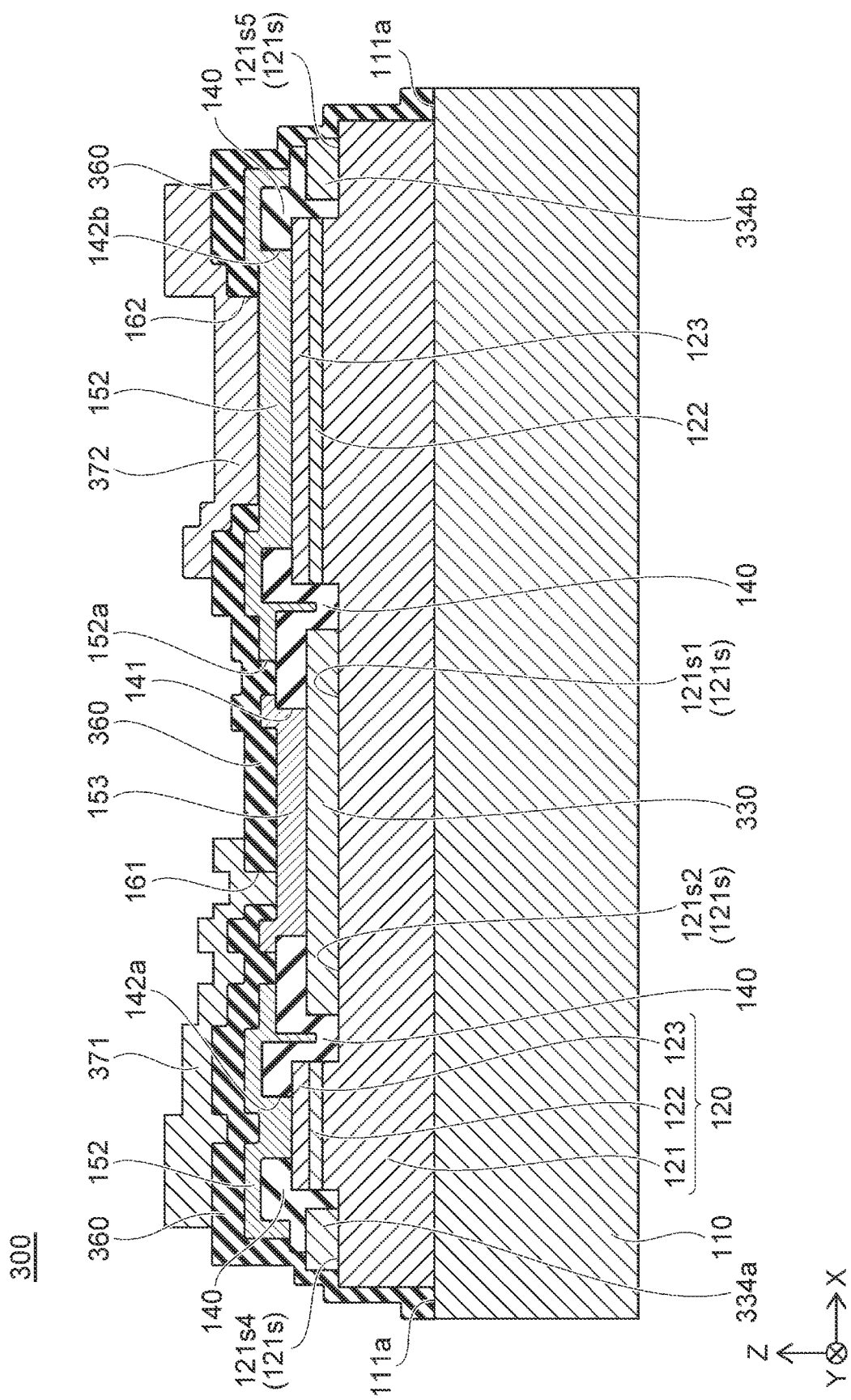
FIG. 14 is a schematic cross-sectional view taken along the line XIV-XIV of FIG. 13.

FIG. 14 is a schematic cross-sectional view taken along the line XIV-XIV of FIG. 13.

Figure 15:
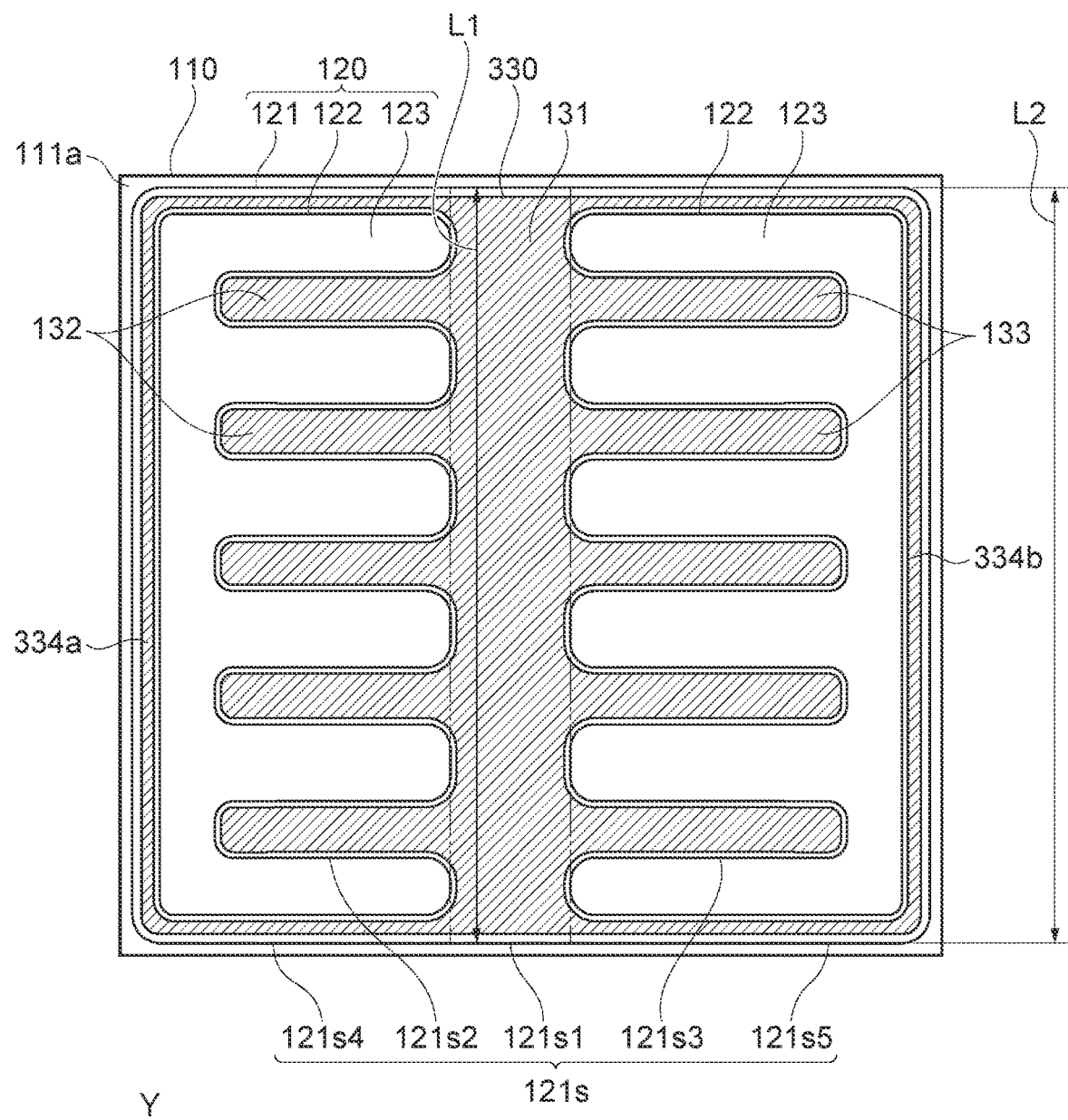
FIG. 15 is a schematic top view of the substrate, the semiconductor layered body, and a first electrode of the light-emitting element according to the third embodiment.

FIG. 15 is a schematic top view of the substrate, the semiconductor layered body, and a first electrode of the light-emitting element according to the present embodiment.

A light-emitting element 300 according to the present embodiment differs from the light-emitting element 100 according to the first embodiment in that a first electrode 330 is disposed also on the fourth region 121s4 of the first semiconductor layer 121.

Specifically, the first electrode 330 includes two outline portions 334a and 334b located on the two fourth regions 121s4 and 121s5 in addition to the first extending portion 131, a plurality of second extending portions 132, and a plurality of third extending portions 133 as shown in FIG. 15. The one outline portion 334a is continuous with both ends of the first extending portion 131 in the Y direction and located over the fourth region 121s4 of the first semiconductor layer 121. The other outline portion 334b is continuous with both ends of the first extending portion 131 in the Y direction and located over the fourth region 121s5 of the first semiconductor layer 121. At least a portion of each of the outline portions 334a and 334b is covered with the insulating layer 140 as shown in FIG. 14.

An insulating layer 360 in the present embodiment has an opening 362 over each second extending region 126c to expose the second electrode 152 in addition to a plurality of openings 162 as shown in FIG. 13. Accordingly, heat generated in the active layer 122 is likely to be propagated to the second electrode 152 through the openings 362. The heat dissipation performance of the light-emitting element 300 can thus be enhanced.

A first pad electrode 371 in the present embodiment further covers a portion of the one outline portion 334a of the first electrode 330 in a top view as shown in FIG. 13 and FIG. 14. Accordingly, heat generated in the one fourth region 121s4 of the first semiconductor layer 121 is easily dissipated to the outside through the first pad electrode 371. The first pad electrode 371 entirely covers the one region 124a of the active layer 122. Accordingly, heat generated in the active layer 122 is easily dissipated to the outside through the first pad electrode 371.

Similarly, a second pad electrode 372 in the present embodiment further covers a portion of the other outline portion 334b of the first electrode 330 in a top view as shown in FIG. 13 and FIG. 14. Accordingly, heat generated in the other fourth region 121s5 of the first semiconductor layer 121 is easily dissipated to the outside through the second pad electrode 372. The second pad electrode 372 entirely covers the other region 124b of the active layer 122. Accordingly, heat generated in the active layer 122 is easily dissipated to the outside through the first pad electrode 371.

As described above, also in the light-emitting element 300 according to the present embodiment, similarly to the light-emitting element 100 according to the first embodiment, the portion 121s of the first semiconductor layer 121 includes the first region 121s1 and a plurality of second regions 121s2. The first electrode 130 is disposed on the first region 121s1 and a plurality of second regions 121s2. The first pad electrode 371 covers the active layer 122 located between a plurality of second regions 121s2 in a top view. Accordingly, similarly to the light-emitting element 100 according to the first embodiment, the light-emitting element 300 that has a broadened region in which a current flows in the active layer 222 and that exhibits good heat dissipation performance can be provided.

The portion 121s of the first semiconductor layer 121 includes the fourth regions 121s4 and 121s5 continuous with the first region 121s1 and lying along the outline of the substrate 110 in a top view. The first electrode 330 is further disposed on the fourth regions 121s4 and 121s5. The contact area between the first semiconductor layer 121 and the first electrode 330 can thus be increased. The increase in the forward voltage can thus be reduced.

What is claimed is:

1. A light-emitting element comprising:
a substrate;
a semiconductor layered body comprising:
  a first semiconductor layer of a first conduction type disposed on the substrate,
  an active layer disposed on the first semiconductor layer, and
  a second semiconductor layer of a second conduction type disposed on the active layer,
  wherein a portion of the first semiconductor layer is exposed from the active layer and the second semiconductor layer;
a first electrode disposed on the exposed portion of the first semiconductor layer and electrically connected to the first semiconductor layer;
a second electrode disposed on the second semiconductor layer and electrically connected to the second semiconductor layer;
a first insulating layer covering the first electrode and the second electrode and having a first opening above the first electrode and a second opening above the second electrode;
a first pad electrode disposed on the first insulating layer and electrically connected to the first electrode through the first opening; and
a second pad electrode disposed on the first insulating layer and electrically connected to the second electrode through the second opening; wherein:
the exposed portion of the first semiconductor layer comprises, in a top view:
  a first region lying between the first pad electrode and the second pad electrode and extending in a first direction parallel to an upper surface of the substrate, and
  a plurality of second regions extending from the first region in a second direction intersecting the first direction, the second direction being a direction from the first region toward the first pad electrode;
the first electrode is disposed on the first region and the plurality of second regions; and
the first pad electrode covers the active layer at locations between the plurality of second regions in a top view.

2. The light-emitting element according to claim 1, wherein:
the exposed portion of the first semiconductor layer comprises a plurality of third regions extending from the first region in a third direction intersecting the first direction in a top view, the third direction being a direction from the first region toward the second pad electrode;
the first electrode is further disposed on the plurality of third regions; and
the second pad electrode covers the active layer at locations between the plurality of third regions in a top view.

3. The light-emitting element according to claim 2, wherein, in a top view, an area of the active layer covered with the first pad electrode and the second pad electrode is 75% or more of an area of the active layer.

4. The light-emitting element according to claim 2, wherein:
the first pad electrode continuously covers the active layer at the locations between the plurality of second regions in a top view and the plurality of second regions; and
the second pad electrode continuously covers the active layer at the locations between the plurality of third regions in a top view and the plurality of third regions.

5. The light-emitting element according to claim 4,
the second semiconductor layer comprises an intermediate region located between the plurality of third regions in a top view; and
the second opening is located above the intermediate region.

6. The light-emitting element according to claim 4, wherein the first opening is located above the first region.

7. The light-emitting element according to claim 5, wherein the first opening is located above the first region.

8. The light-emitting element according to claim 6, wherein the first region comprises a center of the first semiconductor layer in a top view.

9. The light-emitting element according to claim 8, further comprising:
a third electrode disposed between the first electrode and the first insulating layer, electrically connected to the first electrode, and partially exposed from the first opening of the first insulating layer; wherein:
the first pad electrode is electrically connected to the third electrode through the first opening.

10. The light-emitting element according to claim 9, further comprising:
a second insulating layer covering the second semiconductor layer, the active layer, the portion of the first semiconductor layer, and the first electrode and having a third opening over the first electrode and a fourth opening over the second semiconductor layer; wherein:
the third electrode is disposed on the second insulating layer and electrically connected to the first electrode through the third opening; and
the second electrode is disposed on the second insulating layer and electrically connected to the second semiconductor layer through the fourth opening.

11. The light-emitting element according to claim 10, wherein:
the fourth opening overlaps with the active layer at the locations between the plurality of second regions and the active layer at the locations between the plurality of third regions in a top view; and
the second electrode continuously covers the second insulating layer, the fourth opening, and the first electrode in a top view.

12. The light-emitting element according to claim 2, wherein a length of the first region in the first direction is 60% or more of a length of the semiconductor layered body in the first direction.

13. The light-emitting element according to claim 11, wherein a length of the first region in the first direction is 60% or more of a length of the semiconductor layered body in the first direction.

14. The light-emitting element according to claim 12, wherein the active layer comprises two regions separated from each other by the first region.

15. The light-emitting element according to claim 13, wherein the active layer comprises two regions separated from each other by the first region.

16. The light-emitting element according to claim 14, wherein:
the exposed portion of the first semiconductor layer further comprises a fourth region continuous with the first region and lying along an outline of the substrate in a top view; and
the first electrode is further disposed on the fourth region.

17. The light-emitting element according to claim 15, wherein:
- the exposed portion of the first semiconductor layer further comprises a fourth region continuous with the first region and lying along an outline of the substrate in a top view; and
- the first electrode is further disposed on the fourth region.

18. The light-emitting element according to claim 12, wherein the active layer surrounds the first region, the plurality of second regions, and the plurality of third regions in a top view.

19. The light-emitting element according to claim 13, wherein the active layer surrounds the first region, the plurality of second regions, and the plurality of third regions in a top view.

* * * * *